United States Patent
Wang et al.

(10) Patent No.: US 10,739,682 B2
(45) Date of Patent: *Aug. 11, 2020

(54) EDGE-EXPOSURE TOOL WITH AN ULTRAVIOLET (UV) LIGHT EMITTING DIODE (LED)

(71) Applicant: Taiwan Semiconductor Manufacturing Co., Ltd., Hsin-Chu (TW)

(72) Inventors: Ying-Hao Wang, Tainan (TW); Chia-Chi Chung, Hsinchu (TW); Han-Chih Chung, Pingzhen (TW); Yu-Xiang Lin, Zhubei (TW); Yu-Shine Lin, Zhubei (TW); Yu-Hen Wu, Zhubei (TW); Han Wen Hsu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,900

(22) Filed: Nov. 25, 2019

(65) Prior Publication Data

US 2020/0089120 A1 Mar. 19, 2020

Related U.S. Application Data

(63) Continuation of application No. 16/391,521, filed on Apr. 23, 2019, now Pat. No. 10,509,323, which is a
(Continued)

(51) Int. Cl.
*G03F 7/20* (2006.01)
*H01L 21/027* (2006.01)
(Continued)

(52) U.S. Cl.
CPC .......... *G03F 7/2022* (2013.01); *G03F 7/2004* (2013.01); *G03F 7/2028* (2013.01);
(Continued)

(58) Field of Classification Search
None
See application file for complete search history.

(56) References Cited

U.S. PATENT DOCUMENTS 8,846,302 B2 9/2014 Liu et al.
10,295,909 B2 5/2019 Wang et al.
(Continued)

FOREIGN PATENT DOCUMENTS

JP 2013138095 A 7/2013

OTHER PUBLICATIONS

Bell, Ken. "Photoresist Edge Bead Removal Process." Published on Jan. 3, 2017. Retrieved online on Dec. 8, 2017 from https://www.doeingalls.com/photoresist-edge-bead-removal-processes/.
(Continued)

*Primary Examiner* — Michelle M Iacoletti
(74) *Attorney, Agent, or Firm* — Eschweiler & Potashnik, LLC

(57) ABSTRACT

Various embodiments of the present application are directed towards an edge-exposure tool with a light emitting diode (LED), as well as a method for edge exposure using a LED. In some embodiments, the edge-exposure tool comprises a process chamber, a workpiece table, a LED, and a controller. The workpiece table is in the process chamber and is configured to support a workpiece covered by a photosensitive layer. The LED is in the process chamber and is configured to emit radiation towards the workpiece. A controller is configured to control the LED to expose an edge portion of the photosensitive layer, but not a center portion of the photosensitive layer, to the radiation emitted by the
(Continued)

LED. The edge portion of the photosensitive layer extends along an edge of the workpiece in a closed path to enclose the center portion of the photosensitive layer.

20 Claims, 15 Drawing Sheets

Related U.S. Application Data continuation of application No. 15/903,879, filed on Feb. 23, 2018, now Pat. No. 10,295,909.

(60) Provisional application No. 62/563,190, filed on Sep. 26, 2017.

(51) Int. Cl.
| | |
|---|---|
| *H01L 21/67* | (2006.01) |
| *H01L 21/68* | (2006.01) |
| *H01L 21/687* | (2006.01) |
| *H01L 21/02* | (2006.01) |
| *H01L 33/00* | (2010.01) |

(52) U.S. Cl.
CPC ...... *G03F 7/70775* (2013.01); *H01L 21/0274* (2013.01); *H01L 21/67115* (2013.01); *H01L 21/67225* (2013.01); *H01L 21/67253* (2013.01); *H01L 21/681* (2013.01); *H01L 21/02282* (2013.01); *H01L 21/6715* (2013.01); *H01L 21/68714* (2013.01); *H01L 33/005* (2013.01)

(56) References Cited

U.S. PATENT DOCUMENTS

| | | |
|---|---|---|
| 2006/0250594 A1 | 11/2006 | Iwashita et al. |
| 2007/0267582 A1 | 11/2007 | Inagaki |
| 2008/0227299 A1 | 9/2008 | Miller |
| 2009/0168035 A1 | 7/2009 | Kim et al. |
| 2010/0285399 A1 | 11/2010 | Huang et al. |
| 2010/0328638 A1 | 12/2010 | Ishida et al. |

OTHER PUBLICATIONS

Panasonic. LED Type / Lamp Type UV Curing SystemAicure Series. Published Nov. 2016. Retrieved Dec. 20, 2017 from panasonic.net/id/pidsx/global.

Non-Final Office Action dated Oct. 18, 2018 for U.S. Appl. No. 15/903,879.

Notice of Allowance dated Mar. 22, 2019 for U.S. Appl. No. 15/903,879.

Non-Final Office Action dated Jun. 27, 2019 for U.S. Appl. No. 16/391,521.

Notice of Allowance dated Nov. 1, 2019 for U.S. Appl. No. 16/391,521.

300

| PHOTOSENSITIVE MATERIAL TYPE | INTENSITY |
|---|---|
| TYPE 1 | 80% |
| TYPE 2 | 40% |
| ⋮ | ⋮ |
| TYPE N | 66% |

122lt

EDGE-EXPOSURE TOOL WITH AN ULTRAVIOLET (UV) LIGHT EMITTING DIODE (LED)

REFERENCE TO RELATED APPLICATIONS

This Application is a Continuation of U.S. application Ser. No. 16/391,521, filed on Apr. 23, 2019, which is a Continuation of U.S. application Ser. No. 15/903,879, filed on Feb. 23, 2018 (now U.S. Pat. No. 10,295,909, issued on May 21, 2019), which claims the benefit of U.S. Provisional Application No. 62/563,190, filed on Sep. 26, 2017. The contents of the above-referenced patent applications are incorporated herein by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component that can be created) has decreased. Developments in the evolution of ICs include photolithography. Photolithography is a technology for transferring a geometric pattern from a photomask or photoreticle to a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A and 9B through FIGS. 15A and 15B illustrate a series of views of some embodiments of a method for edge exposure using a LED.

DETAILED DESCRIPTION

Figure 1:
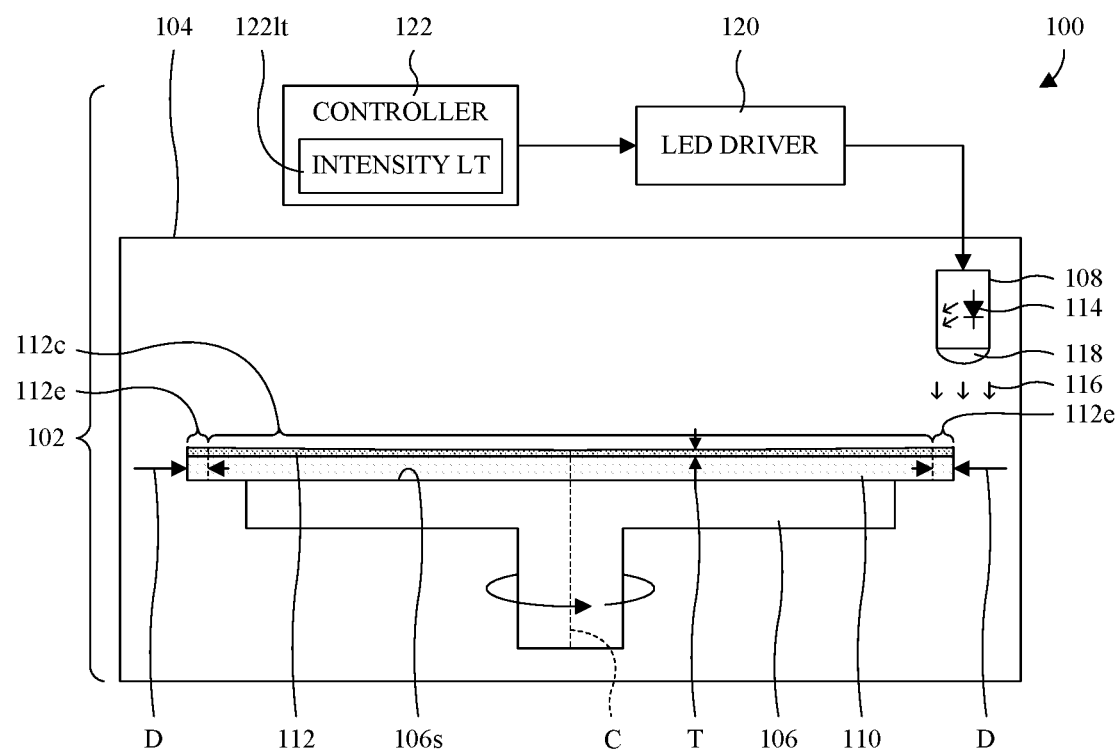
FIG. 1 illustrates a cross-sectional view of some embodiments of an edge-exposure tool using a light-emitting diode (LED).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a photolithography process, a photoresist layer is formed covering an front side of a wafer by a spin coating process. Radiation is generated and passed through a photomask or photoreticle to pattern the radiation. The photoresist layer is exposed to the patterned radiation, and is subsequently developed. The exposure chemically changes a portion of the photoresist layer upon which the patterned radiation impinges to transfer a pattern of the patterned radiation to the photoresist layer. Depending upon the type of photoresist (e.g., positive or negative) used for the photoresist layer, the development removes either the chemically changed portion of the photoresist layer, or a portion of the photoresist layer that was not chemically changed, thereby developing the pattern in the photoresist layer.

A challenge with the photolithography process is that the spin coating process forms the photoresist layer by dispensing a liquid photoresist onto a center of the wafer while the wafer is rotating about the center. Because the wafer is rotating, centrifugal force moves the liquid outward to an edge of the wafer. Ideally, the photoresist would evenly distribute over the wafer, such that the photoresist layer has a substantially uniform thickness. However, in reality, the photoresist builds up at the edge of the wafer, such that the photoresist layer has an increased thickness at the edge of the wafer relative to the center of the wafer. Further, the photoresist wraps around the edge of wafer to a back side of the wafer. The increased thickness of the photoresist layer may lead to, for example, exposure variation between the center of the wafer and the edge of the wafer, and/or may lead to poor control over critical dimensions of the pattern at the edge of the wafer. Further, the edge wrapping may lead to, for example, contamination of process tools used during the photolithography process and during subsequent processing.

A solution to the challenge is edge bead removal (EBR) in which an edge portion of the photoresist layer at or near the edge of the wafer, but not at a center portion of the photoresist layer, is removed. EBR comprises wafer edge exposure (WEE) in which the edge portion is exposed to radiation and subsequently developed to remove the edge portion from the front side of the wafer. A challenge with WEE is that the radiation is generated by a mercury-xenon lamp, which is costly to acquire, costly to operate, costly to maintain, and has a relatively short lifespan. Further, the mercury-xenon lamp is remote from a process tool in which the exposure is performed due to, inter alia, its large size and complexity, such that a radiation guide (e.g., a fiber optic cable) transfers radiation from the mercury-xenon lamp to the process tool. Further yet, the mercury-xenon lamp is unable to instantly turn on and off, such that a shutter gates radiation generated by the mercury-xenon lamp. The radiation guide and the shutter further add to the cost and complexity of the mercury-xenon lamp.

In view of the foregoing, various embodiments of the present application are directed towards an edge-exposure tool with a light emitting diode (LED), as well as a method for edge exposure using a LED. In some embodiments, the edge-exposure tool comprises a process chamber, a workpiece table, a LED, and a controller. The workpiece table is in the process chamber and is configured to support a workpiece covered by a photosensitive layer. The LED is in the process chamber and is configured to emit radiation towards the workpiece. A controller is configured to control the LED to expose an edge portion of the photosensitive layer, but not a center portion of the photosensitive layer, to the radiation emitted by the LED. The edge portion of the photosensitive layer extends along an edge of the workpiece in a closed path to enclose the center portion of the photosensitive layer.

By using the LED for edge exposure, costs are low. For example, the LED has a low acquisition cost, a low operating cost, and a low maintenance cost due its simplified structure relative to a mercury-xenon lamp. Further, the LED has a long lifespan relative to a mercury-xenon lamp. Further, the LED is in the process chamber, such that the LED does not depend on a costly and complex radiation guide. Further, the LED may be changed between an ON state and an OFF state nearly instantly, such that the LED does not depend on a costly and complex shutter. Further, the LED may be retrofitted into existing edge-exposure tools with minimal cost. For example, an open or close command for the shutter of a mercury-xenon lamp may be translated to an ON or OFF command for the LED with a low cost microcontroller.

With reference to FIG. 1, a cross-sectional view 100 of some embodiments of an LED-based edge-exposure tool 102 is provided. As illustrated, a process chamber 104 houses a workpiece table 106 and a LED housing 108. In some embodiments, a temperature within the process chamber 104, a pressure within process chamber 104, gas concentrations within the process chamber 104, or any combination of the foregoing may be controlled and/or varied relative to an ambient environment of the process chamber 104. The workpiece table 106 is configured to support a workpiece 110 on a support surface 106s of the workpiece table 106. Further, the workpiece table 106 is configured to rotate the workpiece 110 about a central axis C of the workpiece table 106 that is at a center of the support surface 106s and that is orthogonal to the support surface 106s. Such rotation may, for example, be achieved by an electric motor or some other mechanical device associated with the workpiece table 106.

The workpiece 110 is covered with a photosensitive layer 112. The photosensitive layer 112 may, for example, be or comprise photoresist or some other suitable photosensitive material. In some embodiments, the photosensitive layer 112 has a non-uniform thickness T increasing from the central axis C to an edge of the workpiece 110. As seen hereafter, this may, for example, be due to the process performed to form the photosensitive layer 112. In some embodiments, the workpiece 110 has a planar top layout that is circular (not visible within the cross-sectional view 100). In some embodiments, the workpiece 110 is or comprises a semiconductor substrate. The semiconductor substrate may be, for example, a bulk monocrystalline silicon substrate, a silicon-on-insulator (all) substrate, a germanium substrate, a group III-V substrate, or some other suitable semiconductor substrate. Further, the semiconductor substrate may be, for example, a 300 millimeter wafer, a 450 millimeter wafer, or some other suitable wafer. In some embodiments, the workpiece 110 further comprises one or more additional layers and/or structures arranged over and/or stacked on the semiconductor substrate. For example, the workpiece 110 may comprise a plurality of semiconductor devices overlying and partially defined by the semiconductor substrate. As another example, the workpiece 110 may comprise the semiconductor devices, and may further comprise a back-end-of-line (BEOL) metallization stack overlying and electrically coupled to the semiconductor devices. The semiconductor devices may be or comprise, for example, metal-oxide-semiconductor (MOS) devices or some other suitable semiconductor devices.

The LED housing 108 accommodates and protects an LED 114. In some embodiments, the LED housing 108 has a high thermal conductivity so as to dissipate heat generated by the LED 114. For example, the LED housing 108 may be copper, aluminum, or some other suitable material with a high thermal conductive. A "high" thermal conductivity may, for example, be a material with a thermal conductivity exceeding about 200 watts per meter-kelvin (W/m K), about 300 W/m K, or about 400 W/m K. Heat reduces a life span of the LED 114, such that dissipating heat generated by the LED 114 with the LED housing 108 may enhance a lifespan of the LED 114. In some embodiments, the LED housing 108 is to the side of the workpiece table 106 and/or overlies an edge portion 112e of the photosensitive layer 112.

The edge portion 112e of the photosensitive layer 112 is a portion of the photosensitive layer 112 at or near a sidewall edge of the workpiece 110 and extends in a closed path (not visible within the cross-sectional view 100) to completely enclose a center portion 112c of the photosensitive layer 112. For example, the edge portion 112e may have a ring-shaped top layout or some other suitable closed-path top layout. The center portion 112c may, for example, have a circular top layout (not visible within the cross-sectional view 100) or some other suitable top layout. Further, the edge portion 112e may, for example, be a portion of the photosensitive layer 112 within a distance D of a sidewall edge of the workpiece 110, where the distance D is about 2-4 millimeters, about 3.5-4.0 millimeters, about 0.5-3.0 millimeters, about 0.5-2.5 millimeters, about 0.5-1.0 millimeters, or less than about 2 millimeters.

The LED 114 is configured to generate and emit radiation 116 towards the edge portion 112e of the photosensitive layer 112. The LED 114 may be, for example, a laser LED or some other suitable LED. The radiation 116 may be or comprise, for example, ultraviolet (UV) radiation, some other radiation that invokes a chemical change in the photosensitive layer 112, or some other radiation suitable for edge exposure. As used herein, the UV radiation may be or comprise, for example, radiation with wavelengths between about 10-400 nanometers, about 200-400 nanometers, about 10-121 nanometers, about 10-200 nanometers, or about 300-450 nanometers. In some embodiments, a LED lens 118 neighbors the LED 114 and/or adjoins the LED housing 108.

The LED lens 118 may, for example, focus the radiation 116 on the edge portion 112e of the photosensitive layer 112, and/or may, for example, collimate the radiation 116 in route to the edge portion 112e of the photosensitive layer 112.

An LED driver 120 drives the LED 114. For example, the LED driver 120 applies a voltage across the LED 114, and regulates the flow of current through the LED 114, to drive the LED 114. Further, the LED driver 120 changes the LED 114 between an ON state and an OFF state, and sets an intensity of the LED 114. The intensity of the LED 114 is proportional to the drive current for the LED 114, such that the LED driver 120 increases the drive current to increase intensity and reduces the drive current to decrease intensity. The drive current for a given intensity may, for example, be determined using a lookup table or a mathematical function describing the relationship between drive current and intensity. In some embodiments, the LED driver 120 drives the LED 114 based on instructions from a controller 122. For example, the LED driver 120 may receive an ON command and an OFF command from the controller 122, and may respectively turn the LED 114 to the ON state and the OFF state in response to the commands. As another example, the LED driver 120 may receive an intensity setting from the controller 122, and may drive the LED 114 with a current to achieve the intensity in response to the intensity setting. The LED driver 120 may, for example, be implemented by an electronic circuit, and may or may not have a microcontroller and/or a microprocessor.

The controller 122 controls the LED driver 120 and coordinates operations of the edge-exposure tool 102. In some embodiments, the controller 122 is or comprises one or more electronic memories and one or more electronic processors. The one or more electronic processors may, for example, execute processor executable instructions on the one or more electronic memories to carry out functions of the controller 122 (described hereafter). Further, in some embodiments, the controller 122 is or comprises a microcontroller, an application-specific integrated circuit (ASIC), some other suitable electronic device(s) and/or circuit(s), or any combination of the foregoing. As used herein, a term (e.g., device or circuit) with a suffix of "(s)" may, for example, be singular or plural.

During use of the edge-exposure tool 102, the workpiece 110 is placed on the workpiece table 106. The controller 122 controls the workpiece table 106 to rotate the workpiece 110. Further, while the workpiece 110 is rotating, the controller 122 controls the LED driver 120 to expose the edge portion 112e of the photosensitive layer 112 to the radiation 116 without exposing a remainder of the photosensitive layer 112 to the radiation 116. Such exposure continues until the edge portion 112e of the photosensitive layer 112 is entirely exposed. The exposure chemically changes the edge portion 112e of the photosensitive layer 112, whereby the edge portion 112e may be removed. For example, a chemical developer may be applied to the photosensitive layer 112 to remove the edge portion 112e of the photosensitive layer 112 without removing the remainder of the photosensitive layer 112.

By using the LED 114 for edge exposure, costs are low. For example, the LED 114 has low acquisition costs, low setup costs, low operating costs, and low maintenance costs due to its simplified structure. Further, the LED 114 has a long lifespan. Further, the LED 114 is in the process chamber 104, such that the LED 114 does not depend on a costly and complex radiation guide. Further, the LED 114 may be changed between an ON state and an OFF state nearly instantly, such that the LED 114 does not depend on a costly and complex shutter.

In some embodiments, the LED 114 is continuously ON during edge exposure. In some of such embodiments, the controller 122 instructs the LED driver 120 when to turn the LED 114 to the ON state and when to turn the LED 114 to the OFF state. In some embodiments, an ON/OFF state of the LED 114 is pulse width modulated during exposure. For example, the ON/OFF state of the LED 114 has a 50% duty cycle (i.e., the ON/OFF time ratio is 1:1). As another example, the ON/OFF state of the LED 114 has a 20% duty cycle (i.e., the ON/OFF time ratio is 1:4). The pulse width modulation of the ON/OFF state of the LED 114 keeps the temperature of the LED 114 low and enhances a lifespan of the LED 114 relative to continuous ON exposure. In some of such embodiments, the LED driver 120 implements the pulse width modulation, and the controller 122 instructs the LED driver 120 when to begin the pulse width modulation and when to end the pulse width modulation. In other embodiments, the controller 122 implements the pulse width modulation and instructs the LED driver 120 when to turn the LED 114 to the ON state and when to turn the LED 114 to the OFF state.

In some embodiments, an intensity of the LED 114 is limited during edge exposure. Limiting the intensity of the LED 114 reduces a temperature of the LED 114, which enhances a lifespan of the LED 114 relative to full intensity exposure. For example, where the LED 114 is continuously ON during exposure, limiting an intensity of the LED 114 to about 60-70%, about 65-70%, or about 50-80% may increase the lifespan of the LED 114 by about 3-4 times, about 2-6 times, or about 3.0-3.5 times. As another example, where the ON/OFF state of the LED 114 is pulse width modulated with a 50% duty cycle, and the intensity of the LED 114 is limited to about 60-70%, about 65-70%, or about 50-80%, the lifespan of the LED 114 may be increased by about 6-7 times, about 5-8 times, or about 6.5-6.8 times.

In some embodiments, the edge-exposure tool 102 is used with multiple different photosensitive materials, each having different exposure intensities. For example, the edge-exposure tool 102 may perform edge exposure on a first workpiece covered by a first photosensitive material having a 50% exposure intensity, and may be further perform edge exposure on a second workpiece covered by a second photosensitive material having a 70% or 85% exposure intensity. Further, in some embodiments, the intensity of the LED 114 is varied depending upon a photosensitive material being exposed (e.g., a material of the photosensitive layer 112). In some embodiments, the controller 122 monitors the photosensitive material and instructs the LED driver 120 what intensity to use during exposure. Further, in some embodiments, the controller 122 maintains a lookup table 122lt indexed by photosensitive material and describing an exposure intensity for each photosensitive material.

By varying the intensity of the LED 114 based on photosensitive material, a lifespan of the LED 114 may be enhanced. For example, when the intensity of the LED 114 is varied based on photosensitive material, and an ON/OFF state of the LED 114 is pulse width modulated, the lifespan of the LED 114 may, for example, be increased by about 6-9 times, about 7-8 times, or about 7.5-8.0 times.

Some photosensitive materials have high exposure intensities relative to other photosensitive materials. Operating the LED 114 at a high exposure intensity causes the LED 114 to operate at a high temperature, which reduces the lifespan of the LED 114 faster than when the LED 114 is operating at a low exposure intensity and hence a low temperature. Further, without varying the intensity of the LED 114 based on photosensitive material, the LED 114 operates at the highest exposure intensity for possible photosensitive materials to ensure each of the possible photosensitive materials is sufficiently irradiated. This is regardless of whether a photosensitive material being irradiated actually depends upon such a high exposure intensity. Therefore, for photosensitive materials with a low exposure intensity, the lifespan of the LED 114 is needlessly reduced. Further, varying the intensity of the LED 114 based on photosensitive material enhances the lifespan of the LED 114.

While the foregoing focused on using the LED 114 within the edge-exposure tool 102, the LED 114 may be used with other types of exposure tools. For example, the LED 114 may be used in an exposure tool in which radiation generated by the LED 114 passes through a photoreticle or photomask to a photosensitive layer to transfer a pattern of the photoreticle or photomask to the photosensitive layer.

Figure 2:
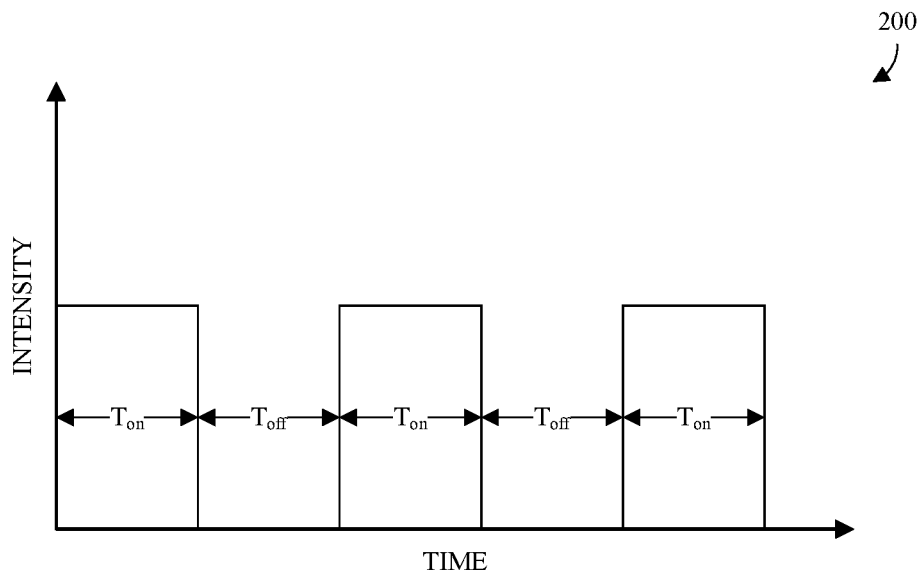
FIG. 2 illustrates a graph of some embodiments of an output of the LED of FIG. 1.

With reference to FIG. 2, a graph 200 of some embodiments of the output of the LED 114 of FIG. 1 is provided. As illustrated, during edge exposure, an ON/OFF state of the LED 114 is pulse width modulated. For example, the LED 114 alternates between an ON state and an OFF state. In some embodiments, an ON time $T_{on}$ of the LED 114 at each cycle is the same as an OFF time $T_{off}$ of the LED 114 at each cycle (i.e., a duty cycle of the pulse width modulation is about 50%). In some embodiments, the ON time $T_{on}$ of the LED 114 is different than the OFF time $T_{off}$ of the LED 114. For example, a ratio between the ON time $T_{on}$ and the OFF time $T_{off}$ may be about 1:4, about 2:5, about 1:6, or about 3:7. In some embodiments, the OFF time $T_{off}$ of the LED 114 is zero (i.e., the duty cycle of the pulse width modulation is about 100%).

Figures 3, 4:
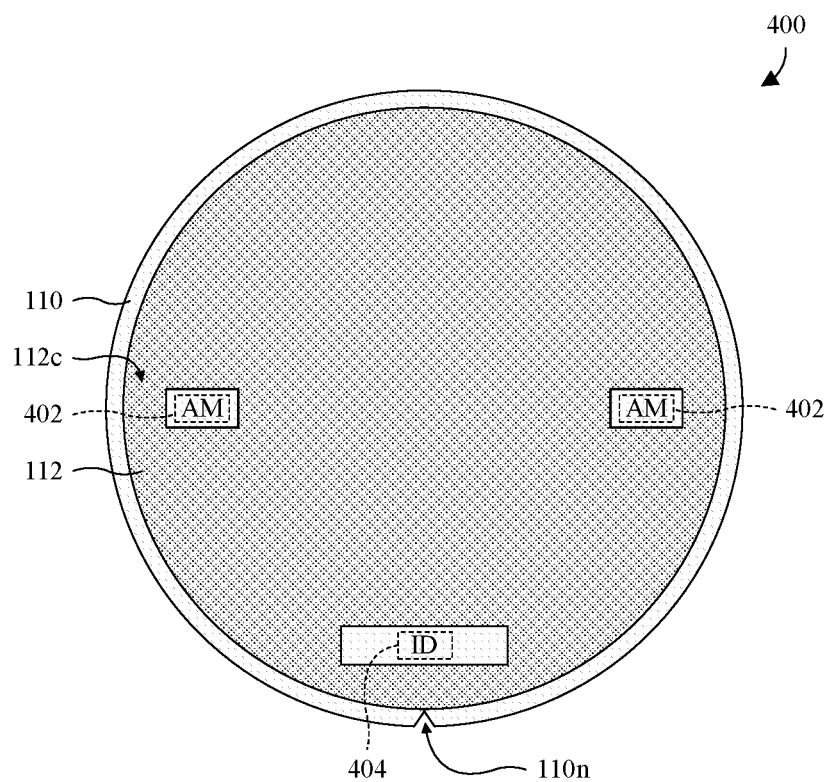
FIG. 3 illustrates a graph of some embodiments of a lookup table for determining an intensity of the LED of FIG. 1 based on photosensitive material.
FIG. 4 illustrates a top layout view of some embodiments of a photosensitive layer after edge exposure and development using the edge-exposure tool of FIG. 1.

With reference to FIG. 3, a view 300 of some embodiments of the lookup table 122*lt* of FIG. 1 is provided. As illustrated, the lookup table 122*lt* has exposure intensities for N different photosensitive materials, where N is an integer value greater than one. As noted above, in some embodiments of the edge-exposure tool 102, the intensity of the LED 114 of FIG. 1 is varied depending on photosensitive material used during edge-exposure.

With reference to FIG. 4, a top layout view 400 of some embodiments of the workpiece 110 and the photosensitive layer 112 after edge exposure and development using the edge-exposure tool 102 of FIG. 1 is provided. As illustrated, the edge portion 112*e* of the photosensitive layer 112 (see FIG. 1) has been removed, thereby leaving the center portion 112*c* of the photosensitive layer 112 and partially uncovering the workpiece 110.

In some embodiments, the workpiece 110 includes a notch 110*n* for coarse alignment of the workpiece 110 to the workpiece table 106 of FIG. 1. Further, in some embodiments, the edge exposure exposes alignment-mark portions of the photosensitive layer 112 and/or a workpiece-id portion of the photosensitive layer 112 so these portions of the photosensitive layer 112 are removed during development. The alignment-mark portions of the photosensitive layer 112 are surrounded by the center portion 112*c* of the photosensitive layer 112 and cover alignment marks 402 on the workpiece 110. The alignment marks 402 may, for example, be used for fine alignment of a photoreticle or photomask to the workpiece 110 during subsequent photolithography processes. The workpiece-id portion of the photosensitive layer 112 is also surrounded by the center portion 112*c* of the photosensitive layer 112 and covers an identifier (ID) 404 of the workpiece 110.

Figure 5A:
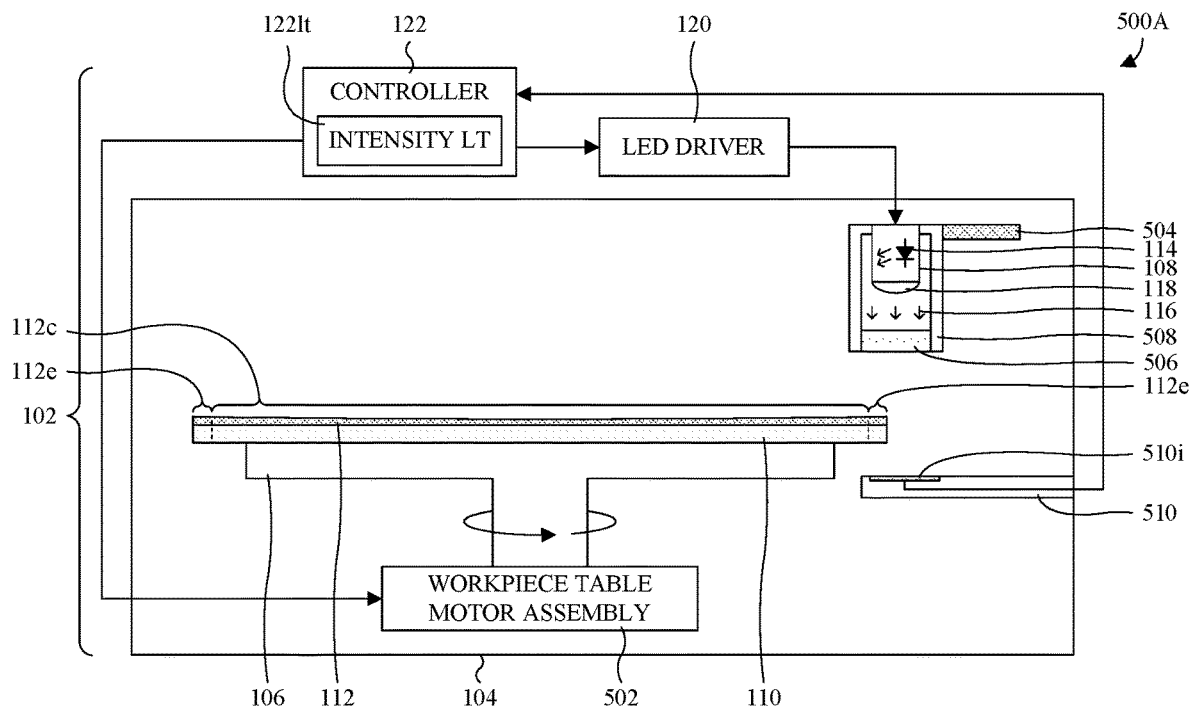
FIGS. 5A and 5B illustrate various views of some more detailed embodiments of the edge-exposure tool of FIG. 1.

With reference to FIG. 5A, a cross-sectional view 500A of some more detailed embodiments of the edge-exposure tool 102 of FIG. 1 is provided. As illustrated, a workpiece table motor assembly 502 is configured to rotate the workpiece table 106. The workpiece table motor assembly 502 is controlled by the controller 122 and may be or comprise, for example, and electric motor or some other suitable mechanical device. Further, the LED housing 108 is supported by a mechanical arm 504. In some embodiments, the LED housing 108 is connected to a second LED lens 506 by a mounting structure 508, and/or is mounted to the mechanical arm 504 by the mounting structure 508.

The second LED lens 506 may, for example, focus the radiation 116 towards the edge portion 112*e* of the photosensitive layer 112, and/or may, for example, collimate the radiation 116 in route to the edge portion 112*e*. In some embodiments, the LED lens 118 collimates the radiation 116, while the second LED lens 506 focuses the radiation 116 towards the edge portion 110*e* of the photosensitive layer 112, or vice versa. In other embodiments, the LED lens 118 is omitted and the second LED lens 506 collimates the radiation 116, and/or focuses the radiation 116 towards the edge portion 112*e* of the photosensitive layer 112.

An imaging structure 510 is to the side of the workpiece table 106, and comprises an image sensor 510*i*. The image sensor 510*i* is configured to sense incident radiation across a light-receiving surface of the image sensor 510*i*. Further, the image sensor 510*i* underlies the edge portion 110*e* of the workpiece 110. The image sensor 510*i* may be or comprise, for example, a charge-coupled device (CCD) image sensor, a complementary metal-oxide-semiconductor (CMOS) image sensor, or some other type of image sensor.

In some embodiments, the image sensor 510*i* provides feedback used to maintain a desired intensity of the LED 114. For a given drive current, an intensity of the LED 114 may gradually decrease from the desired intensity. Therefore, the drive current may be gradually increased to compensate for the gradual decrease in intensity based on feedback from the image sensor 510*i*. For example, if the desired intensity is X and the sensed intensity is Y, which is less than X, the drive current may be increased until X equals Y. The decrease in the intensity may, for example, be due to an increase in a temperature of the LED 114 and/or an increase in a total ON time of the LED 114. For a given drive current, an intensity of the LED 114 may also gradually increase from the desired intensity. Therefore, the drive current may be gradually decreased to compensate for the gradual increase in intensity based on feedback from the image sensor 510*i*. For example, if the desired intensity is X and the sensed intensity is Y, which is greater than X, the drive current may be decreased until X equals Y. The increase in the intensity may, for example, be due to a decrease in the temperature of the LED 114. In some embodiments, the LED driver 120 monitors the image sensor 510*i* and varies the drive current (as described above) to compensate for variations in the intensity of the LED 114 without involvement from the controller 122. In other embodiments, the controller 122 monitors the image sensor 510*i* and instructs the LED driver 120 to vary the drive current (as described above) to compensate for variations in the intensity of the LED 114.

In some embodiments, the image sensor 510*i* is employed to optically locate the edge of the workpiece 110 to enhance alignment of the LED housing 108 to the edge. For example, the image sensor 510*i* may be moved to a location laterally spaced away from the workpiece 110, and may then be moved gradually towards a center of the workpiece table 106 until the edge of the workpiece 110 is optically detected with the image sensor 510*i*.

Figure 5B:
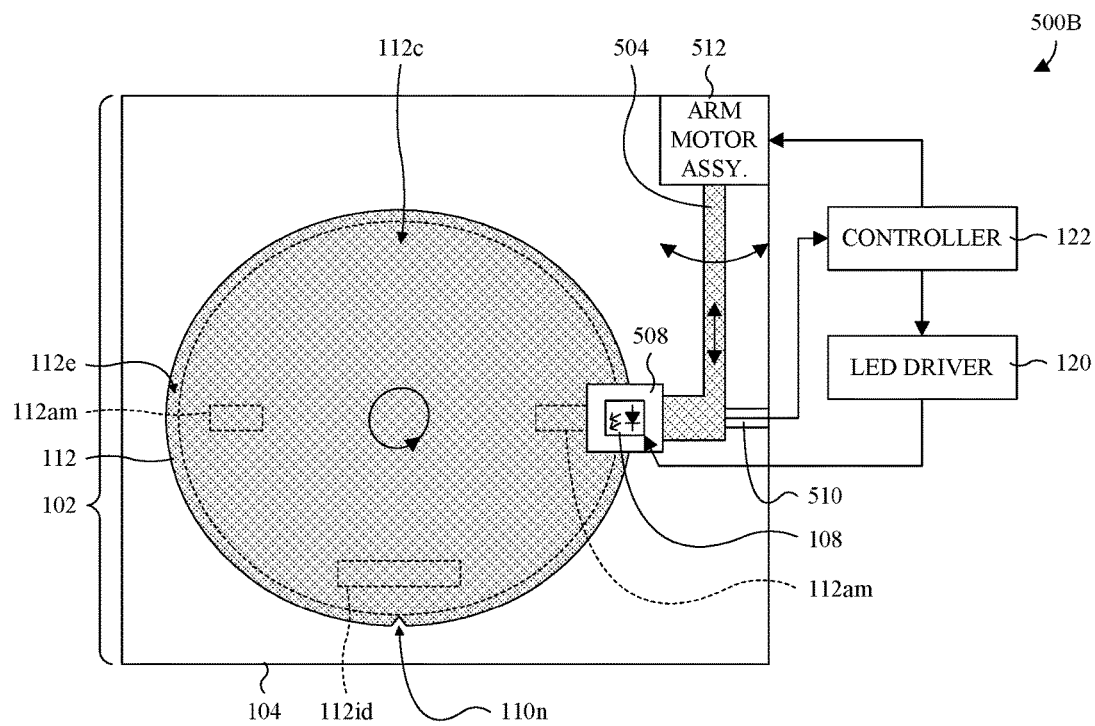

With reference to FIG. 5B, a top layout view 500B of some more detailed embodiments of the edge-exposure tool 102 of FIG. 5A is provided. As illustrated, the edge portion 112*e* of the photosensitive layer 112 extends laterally in a closed path to enclose the center portion 112*c* of the photosensitive layer 112. For example, the edge portion 112*e* of the photosensitive layer 112 may have a ring-shaped top layout or some other suitable closed-path top layout. Further, the alignment-mark portions 112*am* of the photosensitive layer 112 and the workpiece-id portion 112*id* of the photosensitive layer 112 are surrounded by the center portion 112*c* of the photosensitive layer 112. Also illustrated, the mechanical arm 504 is connected to an arm motor assembly 512. The arm motor assembly 512 is controlled by the controller 122. The arm motor assembly 512 may, for example, rotate the mechanical arm 504 and/or telescope the mechanical arm 504 to move the LED housing 108 over the workpiece 110.

Figure 6:
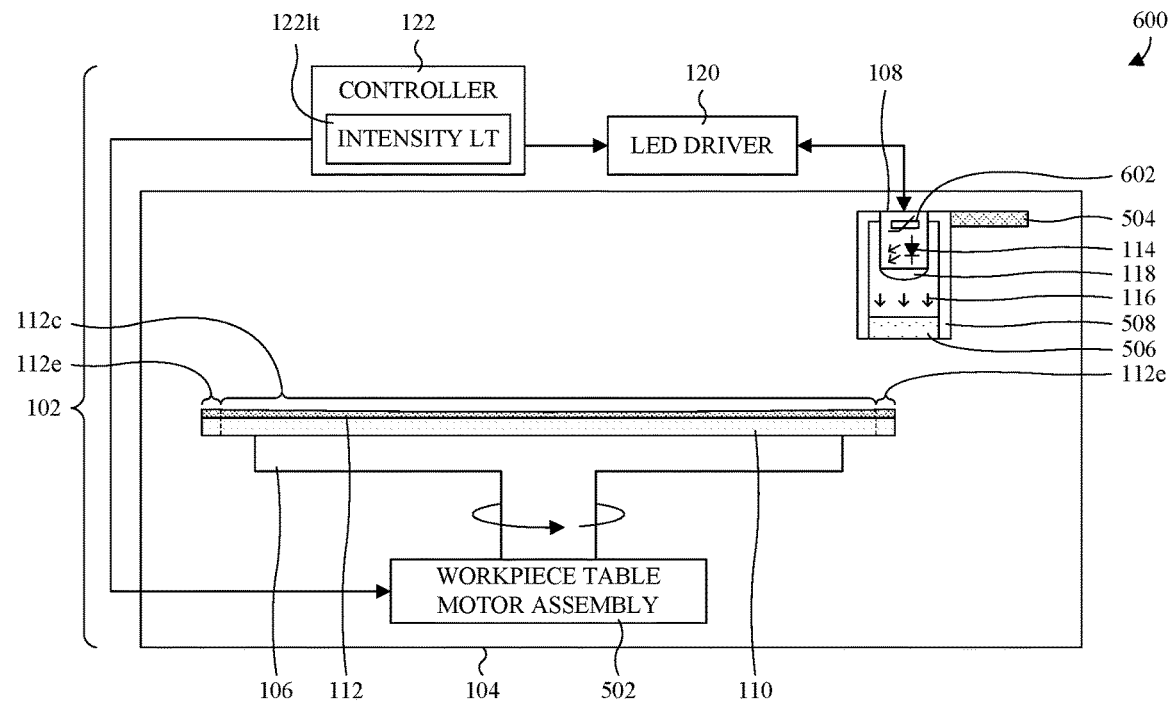
FIGS. 6-8 illustrate cross-sectional views of various other more detailed embodiments of the edge-exposure tool of FIG. 1.

With reference to FIG. 6, a cross-sectional view 600 of some other more detailed embodiments of the edge-exposure tool 102 of FIG. 1 is provided. As illustrated, the imaging structure 510 is omitted and the LED housing 108 further accommodates and protects a temperature sensor 602. The temperature sensor 602 may, for example, be a thermistor or some other suitable temperature sensor.

In some embodiments, the drive current of the LED 114 is varied as a temperature of the LED 114 varies so as to maintain the LED 114 at a desired intensity. For example, for a given drive current, an intensity of the LED 114 may decrease as the temperature of the LED 114 increases. Therefore, the drive current may be increased as the temperature of the LED 114 increases to compensate for the decrease in intensity. As another example, for a given drive current, an intensity of the LED 114 may increase as the temperature of the LED 114 decreases. Therefore, the drive current may be decreased as the temperature of the LED 114 decreases to compensate for the rise in intensity. The temperature of the LED 114 may, for example, be monitored with the temperature sensor 602 and the extent of the increase or decrease in drive current may, for example, determined using a lookup table or a mathematical function describing the relationship between drive current and temperature for a fixed intensity. In some embodiments, the LED driver 120 monitors the temperature of the LED 114 and varies the drive current (as described above) to compensate for variations in the intensity of the LED 114 without involvement from the controller 122. In others embodiments, the controller 122 monitors the temperature of the LED 114 and instructs the LED driver 120 to vary the drive current (as described above) to compensate for variations in the intensity of the LED 114.

In some embodiments, current flowing through the LED 114 is increased as a total ON time of the LED 114 increases so as to maintain the LED 114 at a desired intensity. For example, for a given drive current, an intensity of the LED 114 may decrease as the total ON time of the LED 114 increases. Therefore, the drive current may be increased as the total ON time of the LED 114 increases to compensate for the decrease in intensity. The total ON time of the LED 114 may, for example, be tracked by a timer and stored in flash memory or some other nonvolatile memory. The extent of the increase in drive current may, for example, determined using a lookup table or a mathematical function describing the relationship between drive current and total ON time for a fixed intensity. In some embodiments, the LED driver 120 monitors the total ON time of the LED 114 and increases the drive current (as described above) to compensate for variations in the intensity of the LED 114 without involvement from the controller 122. In others embodiments, the controller 122 monitors the total ON time of the LED 114 (as described above) and instructs the LED driver 120 to vary the drive current (as described above) to compensate for variations in the intensity of the LED 114.

Figure 7:
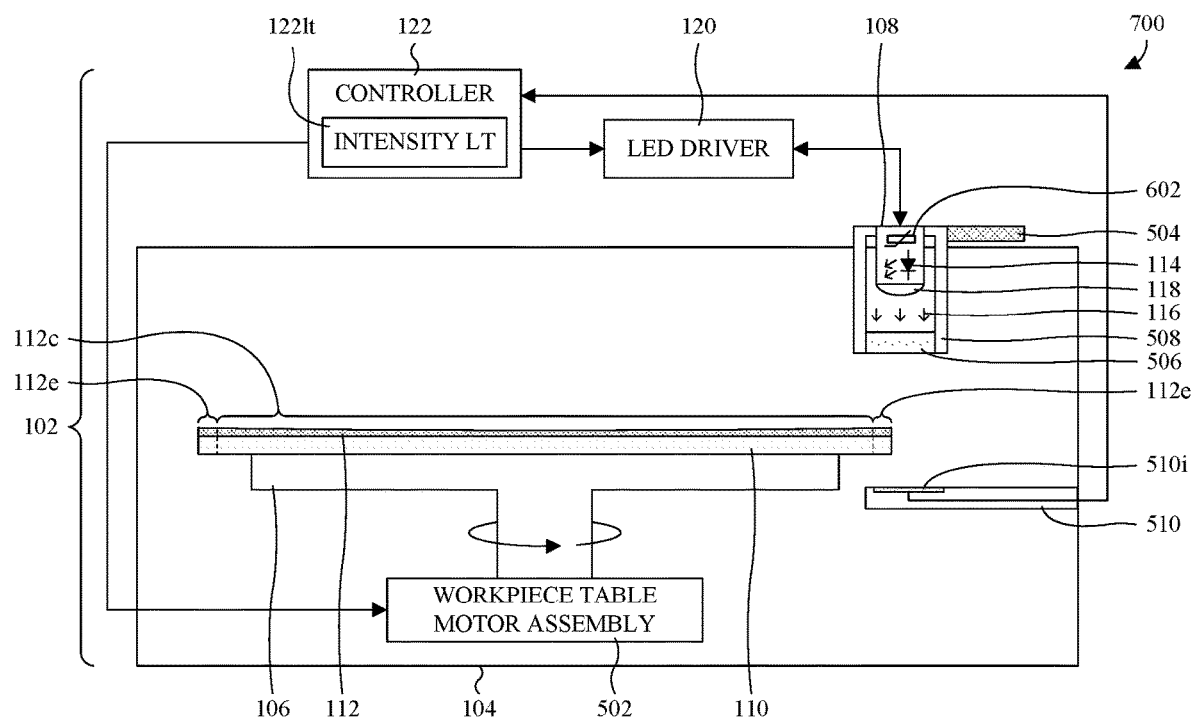

With reference to FIG. 7, a cross-sectional view 700 of some other more detailed embodiments of the edge-exposure tool 102 of FIG. 1 is provided. As illustrated, FIG. 7 is a variant of FIG. 5A that further includes the temperature sensor 602 of FIG. 6. The temperature sensor 602 and/or the image sensor 510*i* may, for example, be employed (as described with regard to FIGS. 5A and 6) to maintain an intensity of the LED 114 at a desired level as total ON time increases and as temperature of the LED 114 varies.

Figure 8:
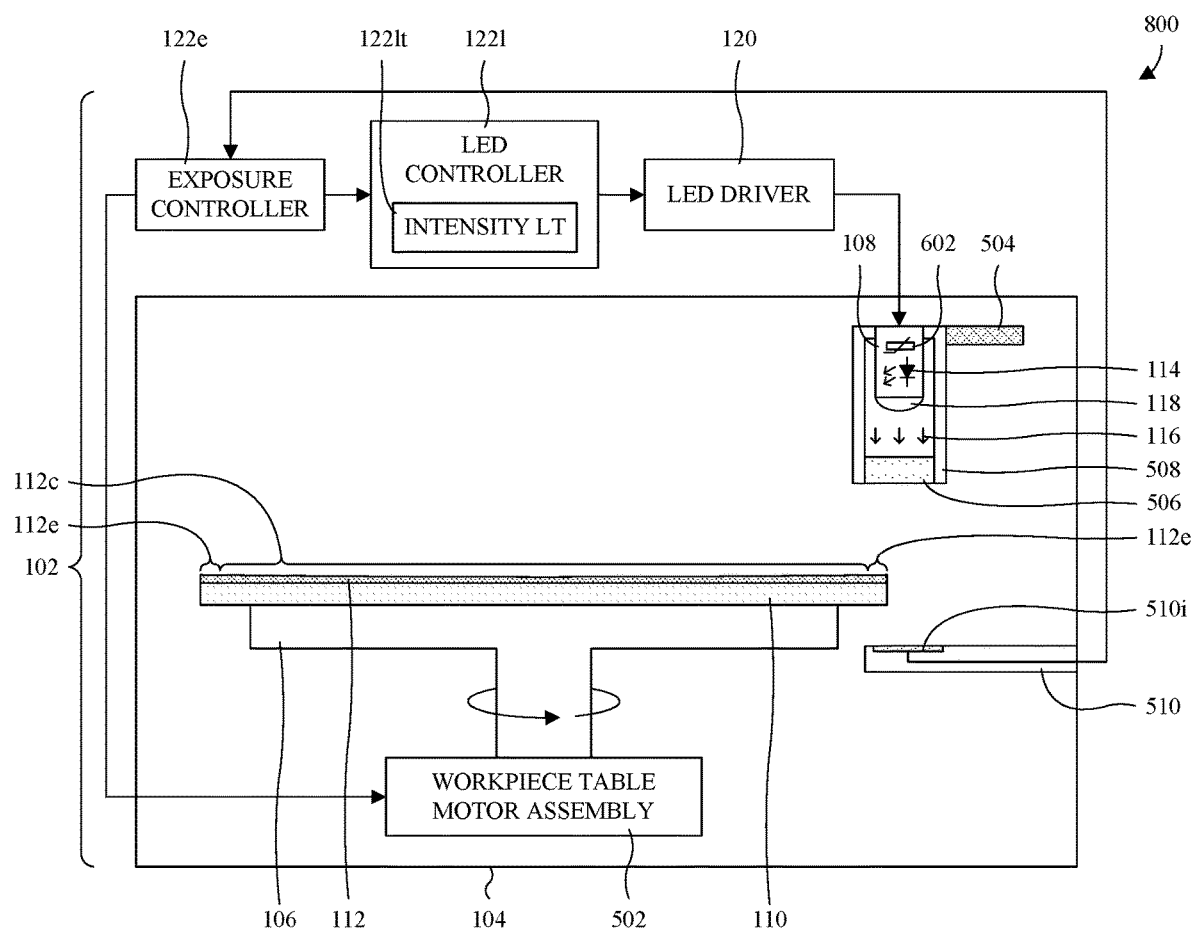

With reference to FIG. 8, a cross-sectional view 800 of some other more detailed embodiments of the edge-exposure tool 102 of FIG. 1 is provided. As illustrated, FIG. 8 is a variant of FIG. 7 in which the controller 122 of FIG. 7 is replaced with both an exposure controller 122*e* and an LED controller 122*l*. As well be explained hereafter, the embodiments of FIG. 8 illustrate how to retrofit an edge-exposure tool to use the LED 114 in place of a lamp, such as, for example, a mercury-xenon lamp or some other suitable lamp.

The exposure controller 122*e* controls the LED controller 122*l* as if it is controlling a lamp. The LED controller 122*l* controls the LED driver 120 based on commands received from the exposure controller 122*e* by translating the received commands into commands that can be interpreted by the LED driver 120, and subsequently providing the translated commands to the LED driver 120. For example, a lamp may not be able to instantly change between an ON state and an OFF state, such that a shutter may be used with the lamp to gate radiation generated by the lamp. Further, the degree to which the shutter is open may be used to control the intensity at which photosensitive material is irradiated by the lamp. Therefore, the LED controller 122*l* may receive a shutter open command, a shutter close command, an illuminance up command, an illuminance down command, or any combination of the foregoing from the exposure controller 122*e*. The shutter open and close commands may respectively be translated to an ON command and an OFF command by the LED controller 122*l* since the LED 114 can instantly or near instantly change between an ON state and an OFF state. The illuminance up and down commands may respectively be translated to a power increase command and a power decrease command by the LED controller 122*l* since the intensity of the LED 114 varies with power. The power increase and decrease commands may, for example, be implemented by the LED driver 120 by respectively increasing and decreasing drive current flowing through the LED 114.

In view of the foregoing, it should be appreciated that when retrofitting an edge-exposure tool to use the LED 114 in place of a lamp, the exposure controller 122*e* does not have to be modified, thereby saving time and money. The LED controller 122*l* represents a virtual shutter (i.e., simulates a shutter), and translates commands for the virtual shutter to commands for the LED 114, such that the exposure controller 122*e* manages the differences between the lamp and the LED 114. Further, while not shown, it should be appreciated that the temperature sensor 602 and/or the imaging structure 510 may be omitted in other embodiments, examples of which are illustrated respectively in FIGS. 5A and 6.

In some embodiments, each of the LED and exposure controllers 122*l*, 122*e* is or comprises one or more electronic memories and one or more electronic processors. The one or more electronic processors may, for example, execute processor executable instructions on the one or more electronic memories to carry out functions of the controller (e.g., the LED or exposure controller 122*l*, 122*e*). Further, in some embodiments, each of the LED and exposure controllers 122*l*, 122*e* is or comprises a microcontroller, an ASIC, some other suitable electronic device(s) and/or circuit(s), or any combination of the foregoing.

With reference to FIGS. 9A and 9B through FIGS. 15A and 15B, a series of views 900A and 900B through 1500A and 1500B of some embodiments of a method for a workpiece 110 using LED-based edge exposure is provided. Figures with a suffix of "A" are cross-sectional views. Figures with a suffix of "B" are top layout views of the workpiece 110 and correspond to like-numbered figures with a suffix of "A".

Figure 9A:
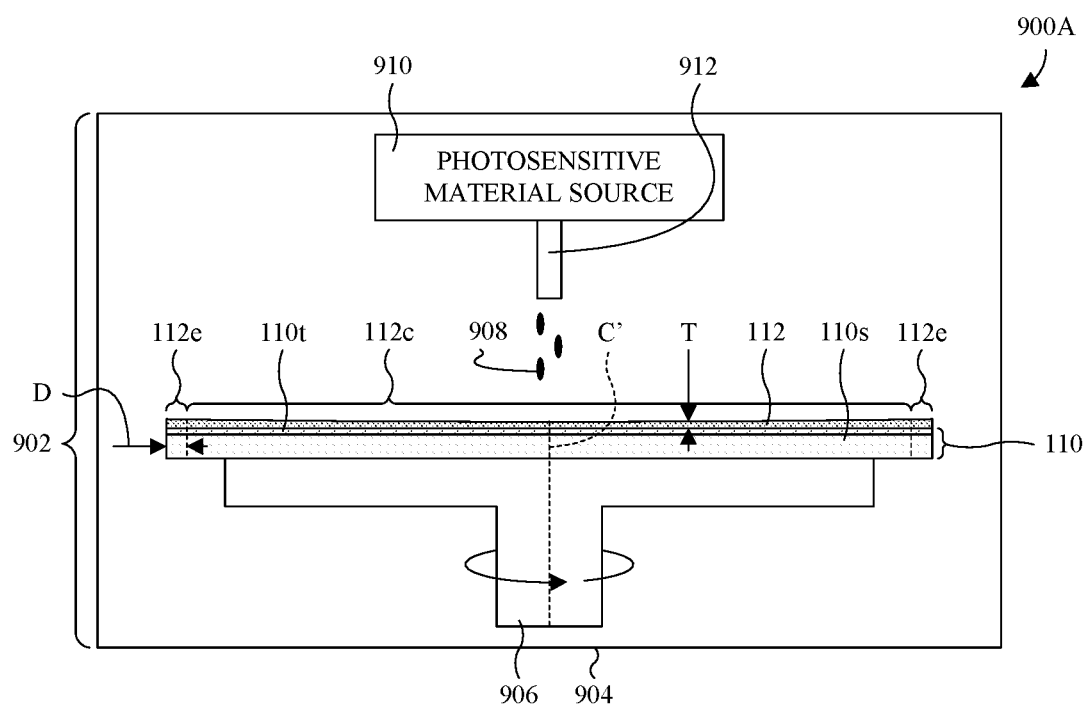
Figure 9B:
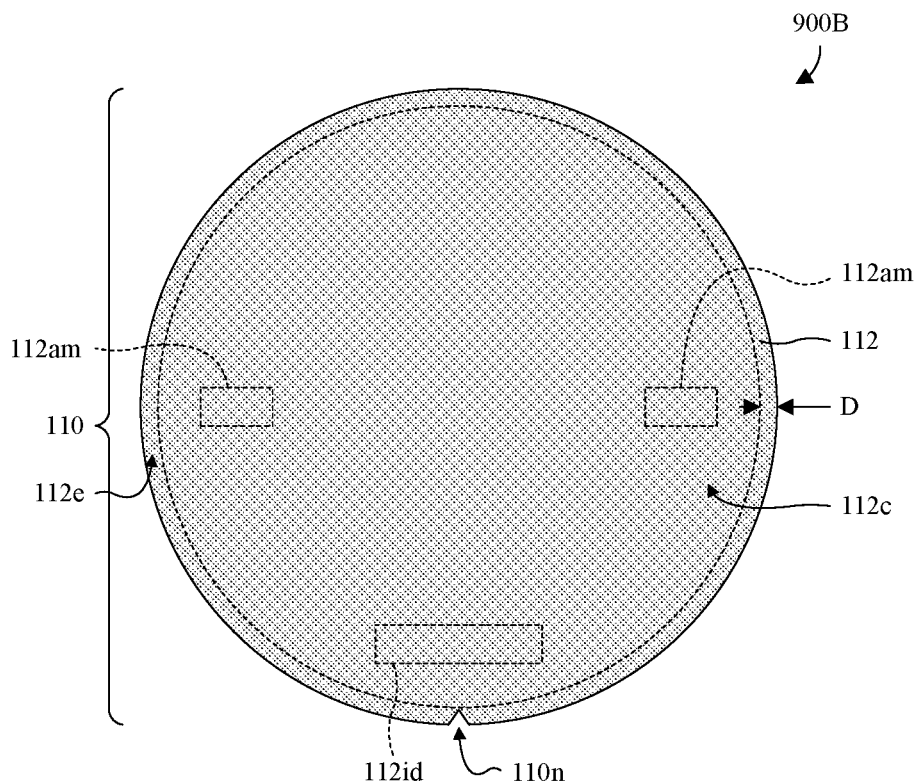

As illustrated by the views 900A, 900B of FIGS. 9A and 9B, a photosensitive layer 112 is deposited on a workpiece 110. The photosensitive layer 112 comprises an edge portion 112*e* and a center portion 112*c*. The edge portion 112*e* is a portion of the photosensitive layer 112 at or near a sidewall edge of the workpiece 110 and extends in a closed path to completely enclose the center portion 112*c*. See FIG. 9B. Further, the edge portion 112*e* may, for example, be a portion of the photosensitive layer 112 within a distance D of a sidewall edge of the workpiece 110, where the distance D is about 2-4 millimeters, about 1.0-1.5 millimeters, about 3.5-4.0 millimeters, about 0.5-3.0 millimeters, about 0.5-2.5 millimeters, about 0.5-1.0 millimeters, or less than about 2 millimeters. In some embodiments, the photosensitive layer 112 further comprise alignment-mark portions 112*am* and/or workpiece-id portion 112*id* that is/are surrounded by the center portion 112*c*. See FIG. 9B. The alignment-mark portions 112*am* overlie alignment marks (not visible) of the workpiece 110, and the workpiece-id portion 112*id* overlies an ID (not visible) of the workpiece 110. The photosensitive layer 112 may, for example, be photoresist or some other suitable photosensitive material.

The workpiece 110 comprises a substrate 110*s* and a target layer 110*t* overlying the substrate 110*s*. As seen hereafter, the target layer 110*t* is a layer of the workpiece 110 to which a pattern is transferred by photolithography. The target layer 110*t* may be or comprise, for example, silicon oxide, silicon nitride, polysilicon, copper, aluminum copper, aluminum, titanium nitride, tantalum nitride, some other suitable material(s), or any combination of the foregoing. In some embodiments, the substrate 110*s* is or comprises a semiconductor substrate. In some embodiments, the substrate 110*s* further comprises one or more additional layers and/or structures arranged over and/or stacked on the semiconductor substrate.

In some embodiments, the depositing of the photosensitive layer 112 is performed using a spin-on-coating tool 902. In some embodiments, a process for depositing the photosensitive layer 112 comprises arranging the workpiece 110 within a process chamber 904 of the spin-on-coating tool 902, on a workpiece table 906 of the spin-on-coating tool 902. In some embodiments, the workpiece 110 comprises a notch 110*n* to facilitate alignment to the workpiece table 906. The workpiece table 906 and the workpiece 110 are then rotated about a central axis C' of the workpiece table 906. Further, while the workpiece 110 is rotated, photosensitive material 908 in liquid form is deposited onto the workpiece 110 at or proximate the central axis C'. The photosensitive material 908 may, for example, be provided to the workpiece 110 from a photosensitive material source 910 through a nozzle 912. Because the workpiece 110 is rotating, centrifugal force moves the photosensitive material 908 outward to an edge of the workpiece 110, thereby defining the photosensitive layer 112. Ideally, the photosensitive material 908 would evenly distribute over the workpiece 110, such that the photosensitive layer 112 would have a thickness T that is uniform or substantially uniform from the central axis C' to the edge of the workpiece 110. However, in reality, the photosensitive material 908 builds up at the edge of the workpiece 110, such that the thickness T of the photosensitive layer 112 increases from the central axis C' to the edge of the workpiece 110.

Figure 10A:
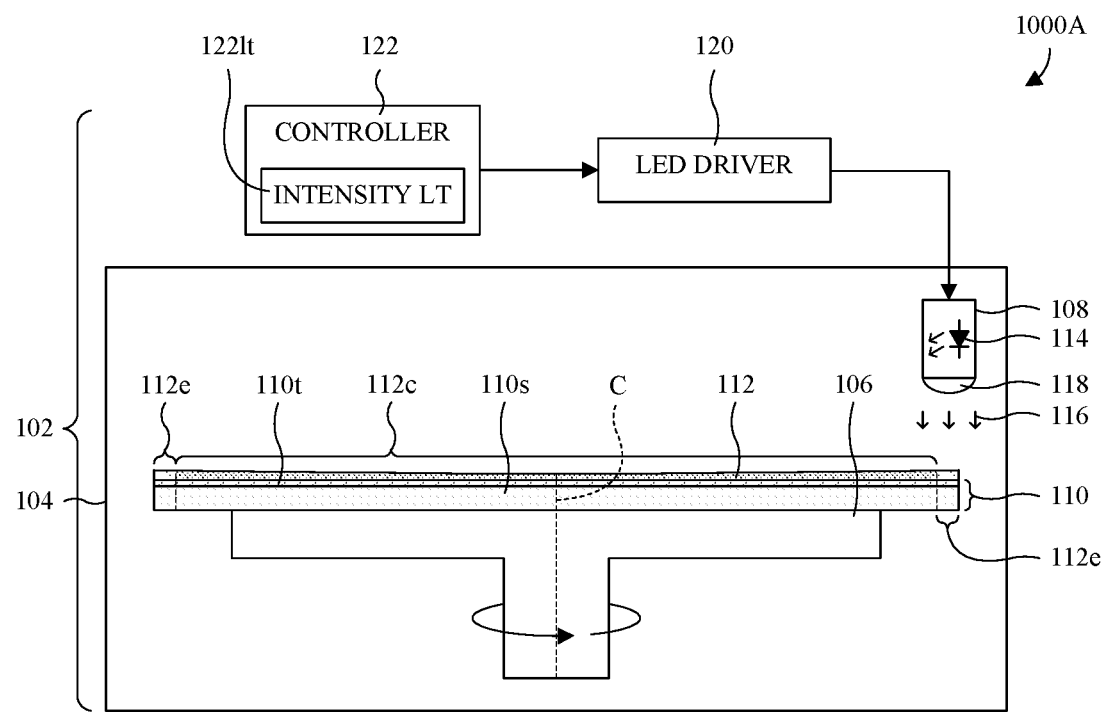
Figure 10B:
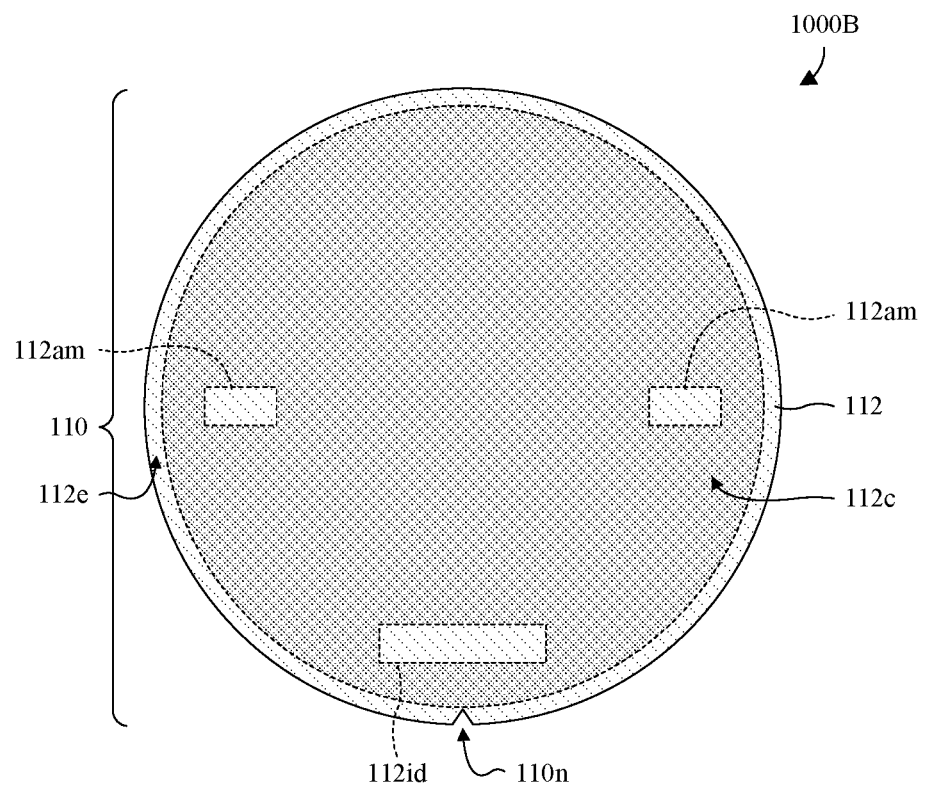

As illustrated by the views 1000A, 1000B of FIGS. 10A and 10B, edge exposure is performed on the workpiece 110 using the edge-exposure tool 102 in any one of FIGS. 1, 5A, 5B, and 6-8. The edge exposure exposes the edge portion 112*e* of the photosensitive layer 112 to radiation 116 from a LED 114 without exposing the center portion 112*c* of the photosensitive layer 112 to the radiation 116. The edge exposure chemically changes the edge portion 112*e*, but not the center portion 112*c*, thereby allowing the edge portion 112*e* to be removed by a chemical developer without removing the center portion 112*c*. The radiation 116 may be or comprise, for example, UV radiation or some other radiation suitable for edge exposure, and/or may have, for example, wavelengths between about 10-400 nanometers, about 200-400 nanometers, about 10-121 nanometers, about 10-200 nanometers, or about 300-450 nanometers.

By using the LED 114 for edge exposure, costs are low. For example, the LED 114 has a low acquisition cost, a low operating cost, and a low maintenance cost. Further, the LED 114 has a long lifespan. Further, the LED 114 is in the process chamber 104, such that the LED 114 does not depend on a costly and complex radiation guide. Further, the LED 114 may be changed between an ON state and an OFF state nearly instantly, such that the LED 114 does not depend on a costly and complex shutter. Further, the LED 114 may be retrofitted into existing edge-exposure tools with minimal cost.

In some embodiments, a process form performing the edge exposure comprises arranging the workpiece 110 within a process chamber 104 of the edge-exposure tool 102, on a workpiece table 106 of the edge-exposure tool 102. The workpiece table 106 and the workpiece 110 are rotated about a central axis C of the workpiece table 106, and the LED 114 is moved within the process chamber 104 to the edge portion 112*e*. Thereafter, while the workpiece 110 is rotating, the LED 114 exposes the edge portion 112*e* to the radiation 116 without exposing a remainder of the photosensitive layer 112 to the radiation 116. Such exposure continues until the edge portion 112*e* is entirely exposed. In some embodiments, the LED 114 is continuously ON during edge exposure. In some embodiments, an ON/OFF state of the LED 114 is pulse width modulated during exposure. The pulse width modulation of the ON/OFF state of the LED 114 keeps the temperature of the LED 114 low and enhances a lifespan of the LED 114 relative to continuous ON exposure. In some embodiments, an intensity of the LED 114 is limited during edge exposure. Limiting the intensity of the LED 114 reduces a temperature of the LED 114, which enhances a lifespan of the LED 114 relative to full intesnsity exposure.

In some embodiments, the intensity of the LED 114 is varied depending upon a type of photosensitive material being exposed. By varying the intensity of the LED 114 depending upon a photosensitive material type being exposed, the lifespan of the LED 114 may be enhanced.

Also illustrated by the views 1000A, 1000B of FIGS. 10A and 10B, in some embodiments, additional exposure is performed on the workpiece 110 using the edge-exposure tool 102 in any one of FIGS. 1, 5A, 5B, and 6-8. The additional exposure is performed in situ without moving the workpiece 110 from its location during edge exposure. The additional exposure exposes the alignment-mark portions 112am of the photosensitive layer 112 and/or the workpiece-id portion 112id of the photosensitive layer 112 to the radiation 116 from the LED 114 without exposing the center portion 112c to the radiation 116. As with the edge exposure, the additional exposure chemically changes the one or more exposed portions of the photosensitive layer 112 (e.g., the alignment-mark portions 112am), but not the one or more unexposed portions of the photosensitive layer 112 (e.g., the center portion 112c), thereby allowing the exposed portion(s) to be removed by a chemical developer without removing the unexposed portion(s).

In some embodiments, a process form performing the additional exposure comprises moving the LED 114 within the process chamber 104 to each portion of the photosensitive layer 112 (e.g., the workpiece-id portion 112id) to be exposed to the radiation 116. At each portion of the photosensitive layer 112 to be exposed to the radiation 116, the LED 114 exposes the portion to the radiation 116 without exposing a remainder of the photosensitive layer 112. In some embodiments, the exposure is performed while the workpiece 110 is stationary (e.g., not rotating). In other embodiments, the exposure is performed while the workpiece 110 is rotating about the central axis C. In such embodiments, the exposure is timed with the rotation of the workpiece 110 using notch 110n of the workpiece 110 as a reference point so only the desired portion of the workpiece 110 is exposed to the radiation 116. In some embodiments, the LED 114 is driven by the LED driver 120 in the same manner as during edge exposure.

Figure 11A:
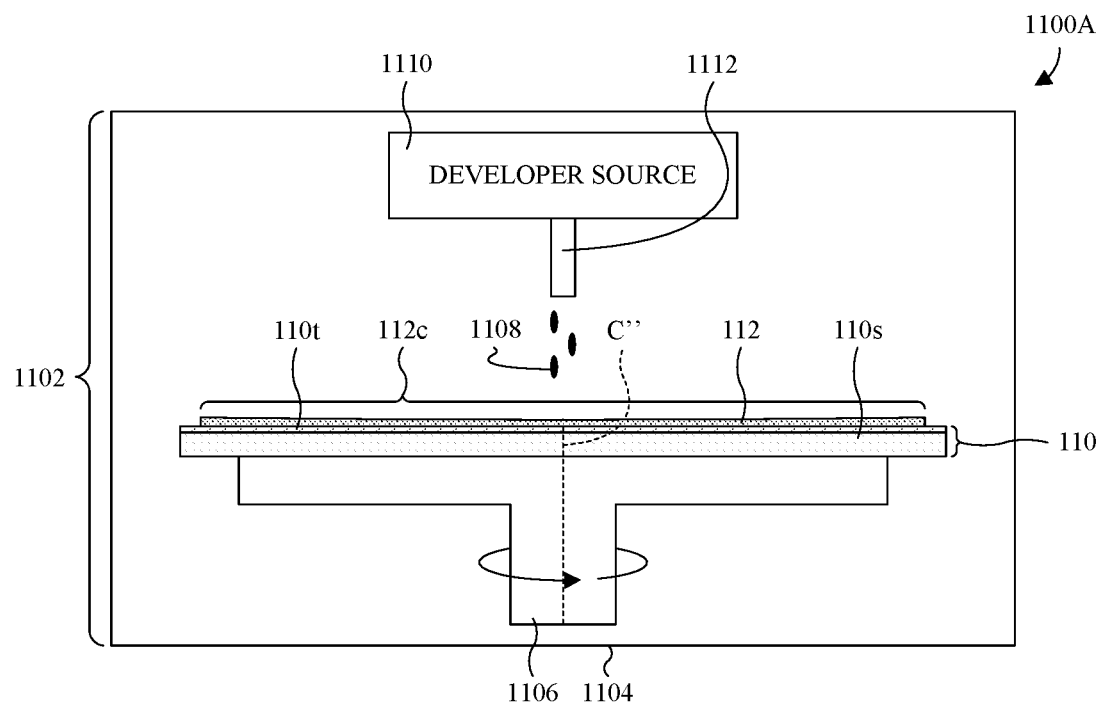
Figure 11B:
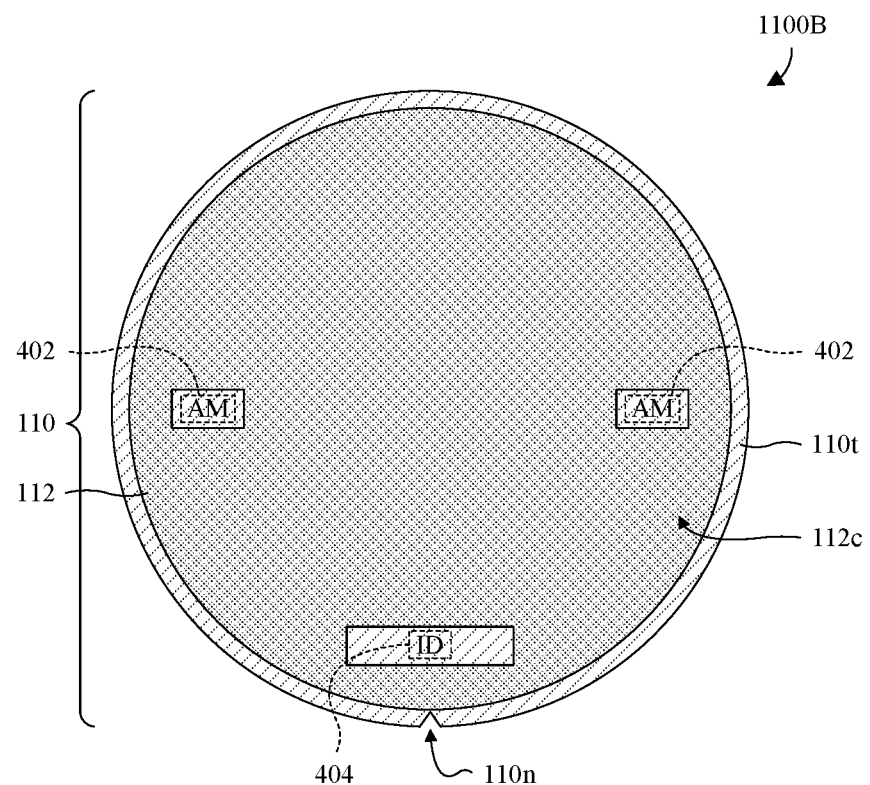

As illustrated by the views 1100A, 1100B of FIGS. 11A and 11B, the edge portion 112e of the photosensitive layer 112 (see FIGS. 10A and 10B) is removed from the workpiece 110, while leaving the center portion 112c of the photosensitive layer 112. This, in turn, uncovers the target layer 110t along the edge of the workpiece 110. In embodiments in which the additional exposure of FIGS. 10A and 10B is performed, the alignment-mark portions 112am of the photosensitive layer 112 (see FIGS. 10A and 10B) and/or the workpiece-id portion 112id of the photosensitive layer 112 (see FIGS. 10A and 10B) is/are also removed. Removing the alignment-mark portions 112am uncovers alignment marks 402 of the workpiece 110. Removing the workpiece-id portion 112id uncovers an ID 404 of the workpiece 110.

In some embodiments, the removal is performed using a developer tool 1102. In some embodiments, a process for performing the removal comprises arranging the workpiece 110 within a process chamber 1104 of the developer tool 1102, on a workpiece table 1106 of the developer tool 1102. In some embodiments, the notch 110n of the workpiece 110 facilitates alignment of the workpiece 110 to the workpiece table 1106. The workpiece table 1106 and the workpiece 110 are then rotated about a central axis C" of the workpiece table 1106. Further, while the workpiece 110 is rotated, a chemical developer 1108 in liquid form is deposited onto the workpiece 110 at or proximate the central axis C". The chemical developer 1108 may, for example, be provided to the workpiece 110 from a developer source 1110 through a nozzle 1112. Because the workpiece 110 is rotating, centrifugal force moves the chemical developer 1108 outward to an edge of the workpiece 110. The chemical developer 1108 reacts with the one or more portions of the photosensitive layer 112 exposed to the radiation 116 of FIGS. 10A and 10B, and removes the portion(s) of the photosensitive layer 112.

Figure 12A:
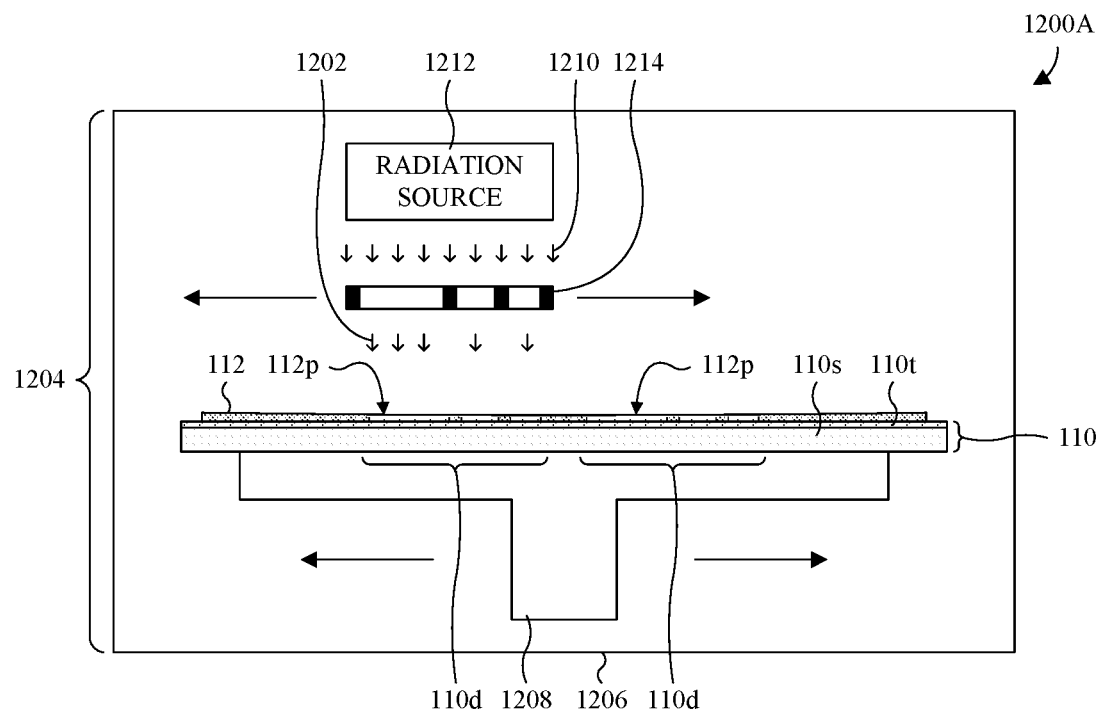
Figure 12B:
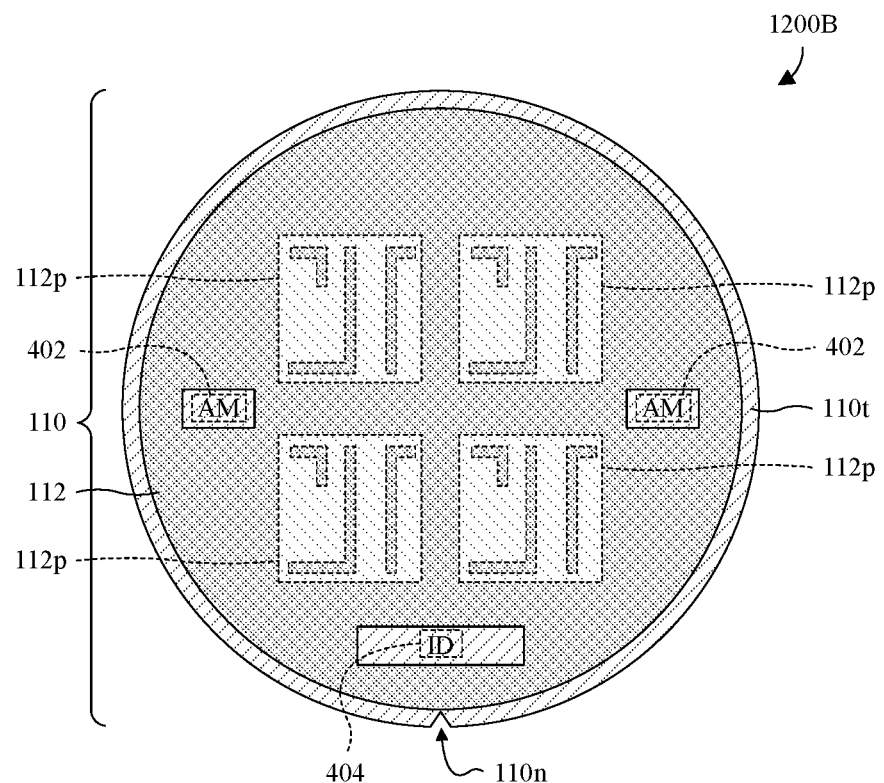

As illustrated by the views 1200A, 1200B of FIGS. 12A and 12B, the photosensitive layer 112 is exposed to patterned radiation 1202. Pattern portions 112p of the photosensitive layer 112 upon which the patterned radiation 1202 impinges undergo a chemical change, whereas a remainder of the photosensitive layer 112 remains unchanged, thereby transferring a pattern of the patterned radiation 1202 to the photosensitive layer 112. In some embodiments, the workpiece 110 comprises a plurality of die regions 110d and the photosensitive layer 112 is individually exposed to the patterned radiation 1202 at each of the die regions 110d.

In some embodiments, the exposure is performed by a photolithography exposure tool 1204. The photolithography exposure tool 1204 may be, for example, a scanner and/or a stepper. In some embodiments, a process for performing the exposure comprises arranging the workpiece 110 within a process chamber 1206 of the photolithography exposure tool 1204, on a workpiece table 1208 of the photolithography exposure tool 1204. Unpatterned radiation 1210 is then generated by a radiation source 1212 and passed through a photomask or photoreticle 1214. The photomask or photoreticle 1214 imparts a pattern on the unpatterned radiation 1210 to generate the patterned radiation 1202. The patterned radiation 1202 impinges on the photosensitive layer 112 and transfers the pattern to the photosensitive layer 112. In some embodiments, the workpiece table 1208 and/or the photomask or photoreticle 1214 move laterally relative to one another to change the location at which the patterned radiation 1202 impinges on the photosensitive layer 112.

Figure 13A:
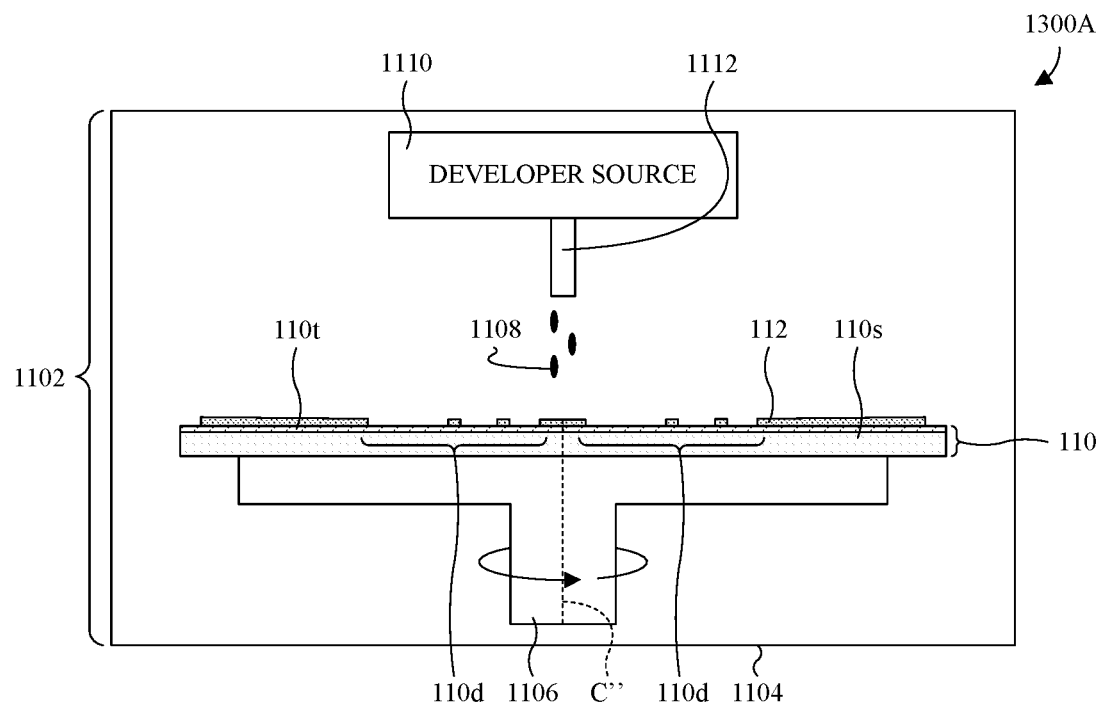
Figure 13B:
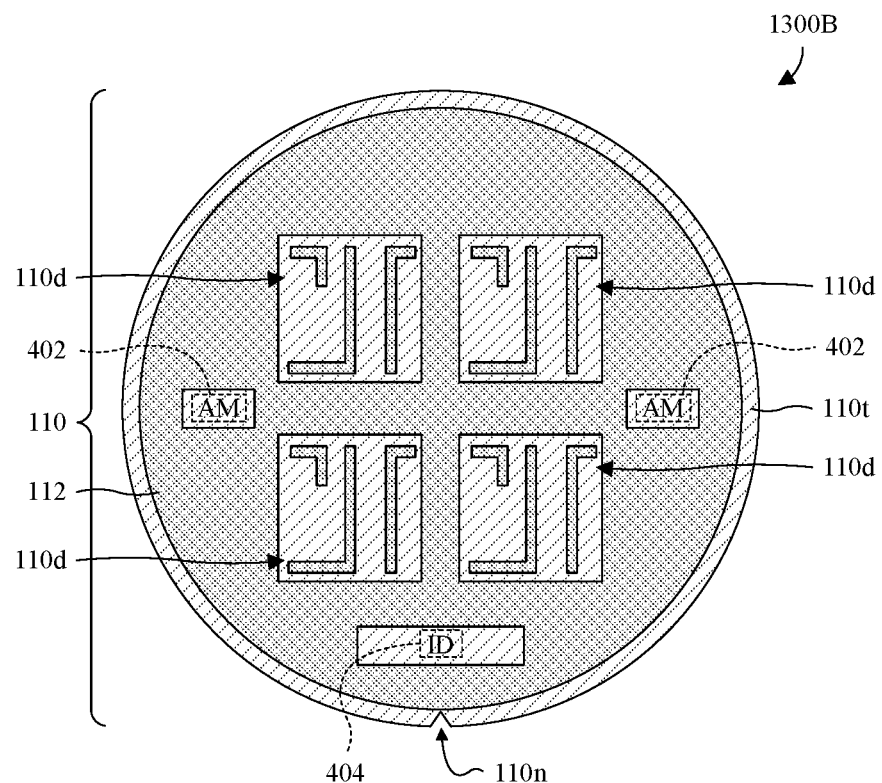

As illustrated by the views 1300A, 1300B of FIGS. 13A and 13B, the pattern portions 112p of the photosensitive layer 112 (see FIGS. 12A and 12B) are removed from the workpiece 110, while leaving a remainder of the photosensitive layer 112. The removal, in turn, uncovers some of the target layer 110t. For example, in embodiments in which the workpiece 110 comprises the die regions 110d, the removal partially uncovers the die regions 110d.

In some embodiments, the removal is performed using the developer tool 1102. In some embodiments, a process for performing the removal comprises arranging the workpiece 110 within the process chamber 1104 of the developer tool 1102, on the workpiece table 1106 of the developer tool 1102. The workpiece table 1106 and the workpiece 110 are then rotated about the central axis C" of the workpiece table 1106. Further, while the workpiece 110 is rotated, the chemical developer 1108 is deposited onto the workpiece 110 at or proximate the central axis C". Because the workpiece 110 is rotating, centrifugal force moves the chemical developer 1108 outward to an edge of the workpiece 110. The chemical developer 1108 reacts with the pattern portions 112p of the photosensitive layer 112 exposed to the patterned radiation 1202 of FIGS. 12A and 12B, and removes the pattern portions 112p.

Figure 14A:
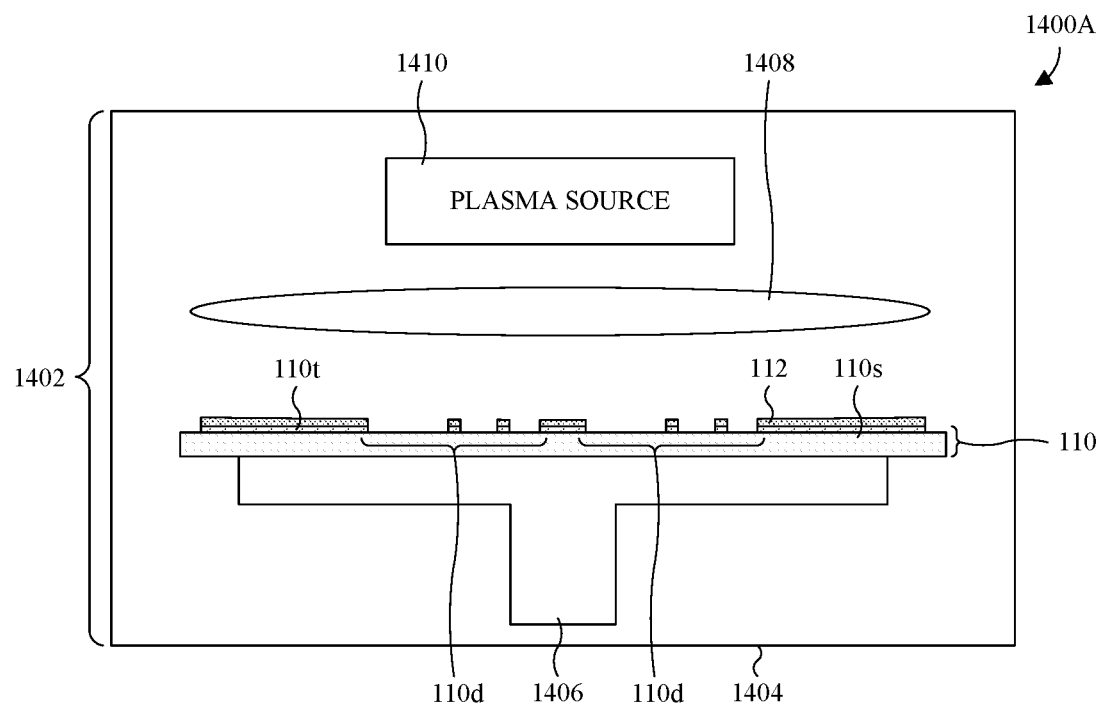
Figure 14B:
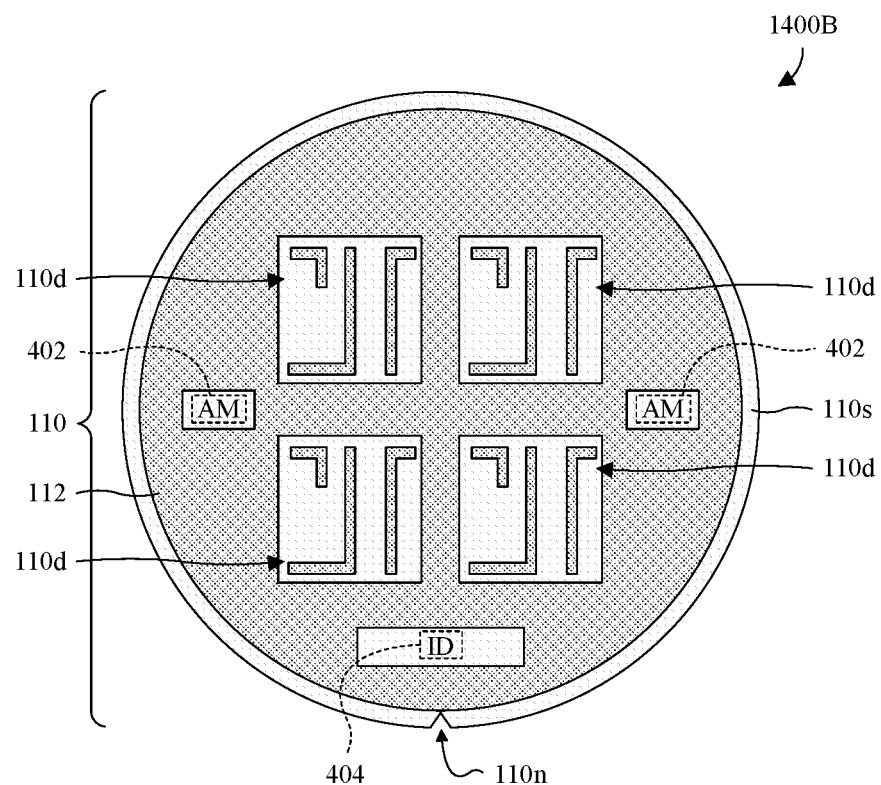

As illustrated by the views 1400A, 1400B of FIGS. 14A and 14B, an etch is performed into the target layer 110t of the workpiece 110 with the photosensitive layer 112 in place. During the etch, the photosensitive layer 112 serves as a mask and a pattern of the photosensitive layer 112 is transferred to the target layer 110t. In some embodiments, an etchant of the etch has a first etch rate for the target layer 110t and a second etch rate for the photosensitive layer 112, where the first etch rate is substantially greater than the second etch rate. Due to the disparity between the first and second etch rates, the photosensitive layer 112 is minimally etched during the etch. In some embodiments, the substrate 110s of the workpiece 110 serves as an etch stop for the etch. For example, an etchant used for the etch may have the first etch rate for the target layer 110t and a third etch rate for the substrate 110s, where the first etch rate is substantially greater than the third etch rate. Due to the disparity between the first and third etch rates, the substrate 110s is minimally etched during the etch. As used above, "substantially greater" may, for example, be at least an order or magnitude greater, or may, for example, be about 5-50 times greater, about 5-20 times greater, or about 20-50 times greater.

In some embodiments, the etch is performed using an etch tool 1402. The etch tool 1402 may, for example, be a plasma etch tool, a wet etch tool, or some other suitable etch tool. In some embodiments, a process for performing the etch comprises arranging the workpiece 110 within a process chamber 1404 of the etch tool 1402, on a workpiece table 1406 of the etch tool 1402. Further, plasma 1408 is generated by a plasma source 1410 and applied to the workpiece 110 with the photosensitive layer 112 in place.

Figure 15A:
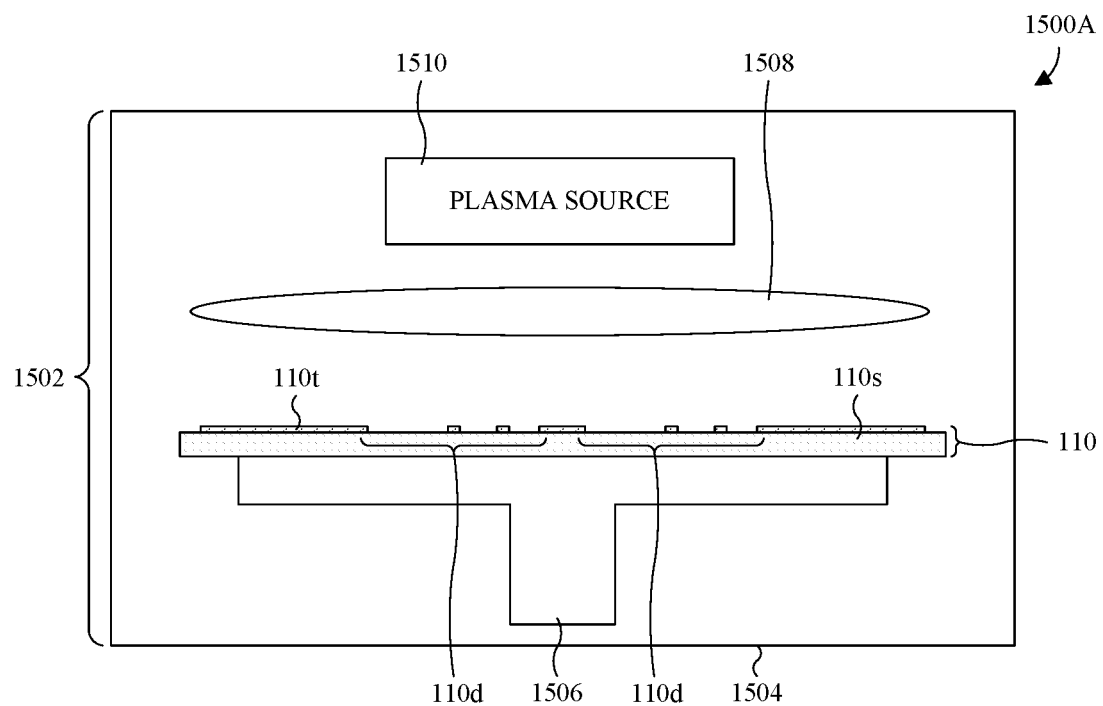
Figure 15B:
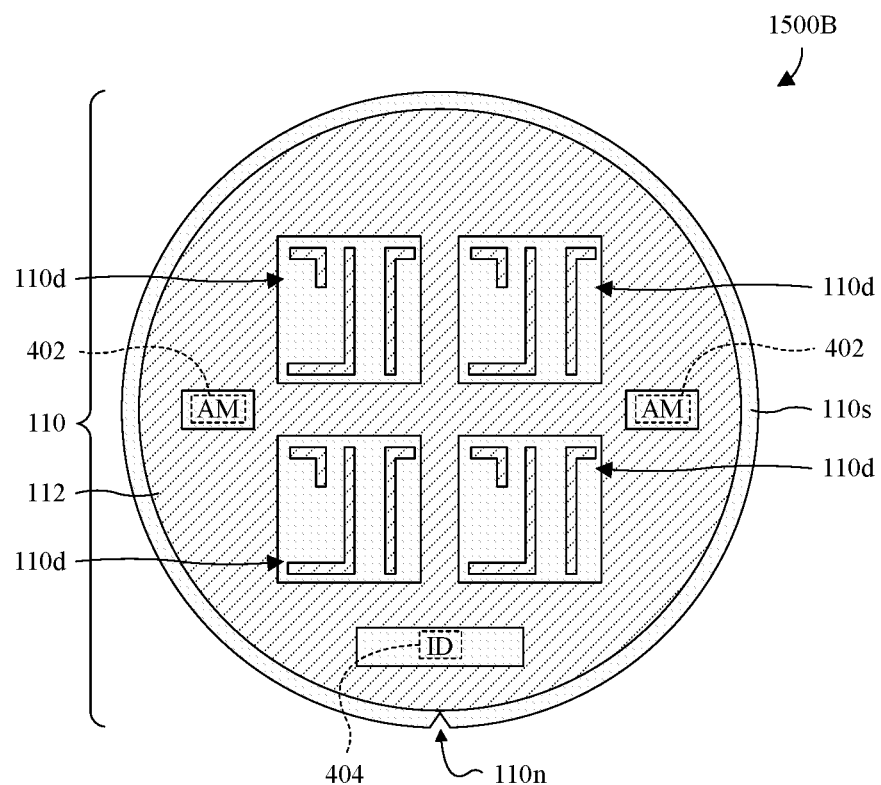

As illustrated by the views 1500A, 1500B of FIGS. 15A and 15B, the photosensitive layer 112 is removed. In some embodiments, the removal is performed by plasma ashing within a plasma ashing tool 1502. In some embodiments, a process for performing the plasma ashing comprises arranging the workpiece 110 within a process chamber 1504 of the plasma ashing tool 1502, on a workpiece table 1506 of the plasma ashing tool 1502. Further, plasma 1508 is generated by a plasma source 1510 and applied to the photosensitive layer 112.

Figure 16:
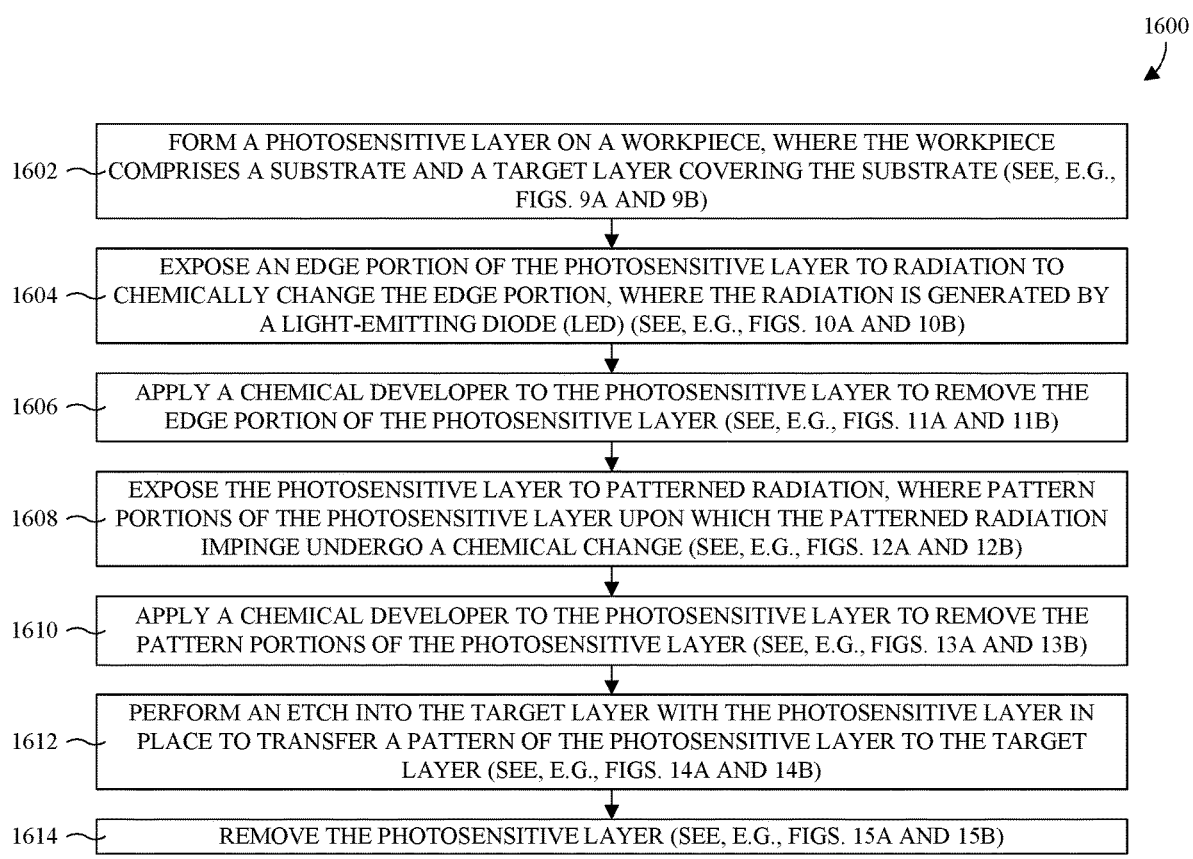
FIG. 16 illustrates a flowchart of some embodiments of the method of FIGS. 9A and 9B through FIGS. 15A and 15B.

With reference to FIG. 16, a flowchart 1600 of some embodiments of the method of FIGS. 9A and 9B through FIGS. 15A and 15B is provided.

At 1602, a photosensitive layer is formed on a workpiece, where the workpiece comprises a substrate and a target layer covering the substrate. See, for example, FIGS. 9A and 9B.

At 1604, an edge portion of the photosensitive layer is exposed to radiation to chemically change the edge portion, where the radiation is generated by a LED. See, for example, FIGS. 10A and 10B. In some embodiments, a workpiece-id portion of the photosensitive layer and/or alignment-mark portions of the photosensitive layer is/are also exposed to the radiation to chemical change these one or more portions. By using the LED for edge exposure, costs are low. For example, the LED has a low acquisition cost, a low operating cost, and a low maintenance cost. Further, the LED has a long lifespan and may be retrofitted into existing edge-exposure tools with minimal cost.

At 1606, a chemical developer is applied to the photosensitive layer to remove the edge portion of the photosensitive layer. See, for example, FIGS. 11A and 11B.

At 1608, the photosensitive layer is exposed to patterned radiation, where pattern portions of the photosensitive layer upon which the patterned radiation impinge undergo a chemical change. See, for example, FIGS. 12A and 12B.

At 1610, a chemical developer is applied to the photosensitive layer to remove the pattern portions of the photosensitive layer. See, for example, FIGS. 13A and 13B.

At 1612, an etch is performed into the target layer with the photosensitive layer in place to transfer a pattern of the photosensitive layer to the target layer. See, for example, FIGS. 14A and 14B.

At 1614, plasma ashing is performed to remove the photosensitive layer. See, for example, FIGS. 15A and 15B.

While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the exposure at 1604 of FIG. 16 may be repeated multiple times for different workpieces, each covered by a photosensitive layer. For example, the method of FIG. 16 may be repeated multiple times for the different workpieces, such that the exposure at 1604 may repeated multiple times for the different workpieces. Further, in some embodiments, the exposure intensity may be varied depending upon the photosensitive material of the photosensitive layer. The edge exposure may, for example, be performed within the edge-exposure tool 102 in any one of FIGS. 1, 5A, 5B, and 6-8.

Figure 17:
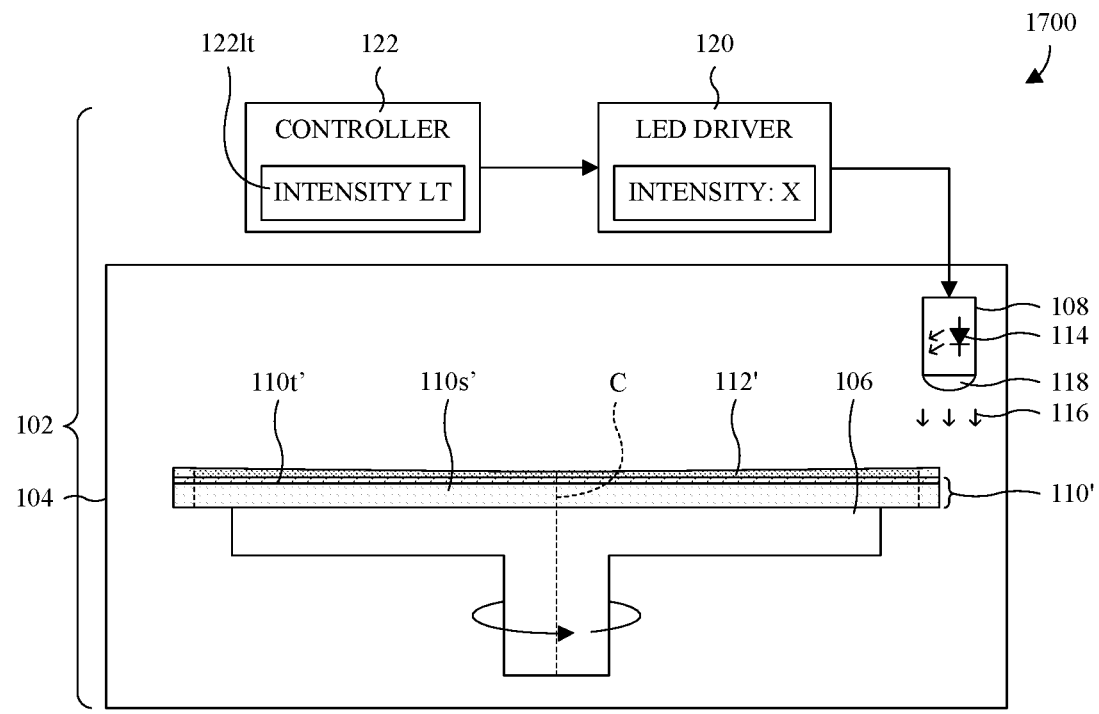
FIGS. 17 and 18 illustrate a series of cross-sectional views of LED-based edge exposure on multiple workpieces respectively covered by different photosensitive materials.
Figure 18:
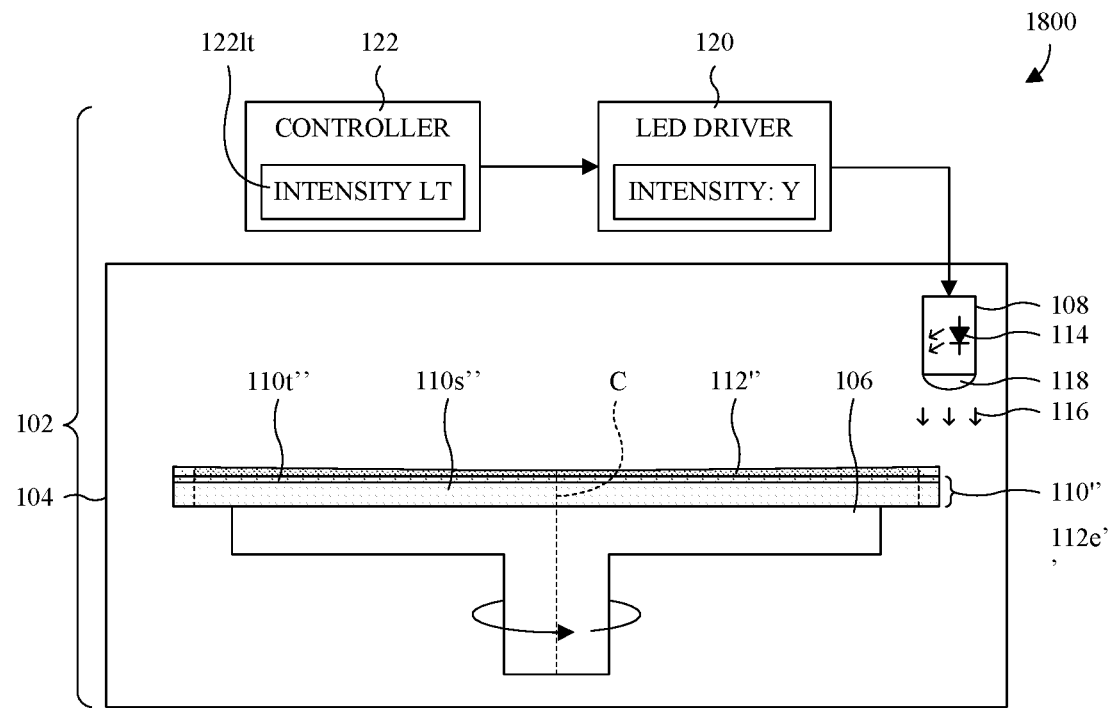

With reference to FIGS. 17 and 18, a series of cross-sectional views 1700, 1800 illustrate the edge-exposure tool 102 performing edge exposure respectively on a first workpiece 110' and a second workpiece 110". The first workpiece 110' is covered by a first photosensitive layer 112' and, in some embodiments, comprises a first substrate 110s' and first target layer 110t' covering the first substrate 110s'. The second workpiece 110" is covered by a second photosensitive layer 112" and, in some embodiments, comprises a second substrate 110s" and second target layer 110t" covering the second substrate 110s". The first and second substrates 110s', 110s" may, for example, each be as the substrate 110s of FIGS. 9A and 9B is described, and the first and second target layers 110t', 110t" may, for example, be each be as the target layer 110t of FIGS. 9A and 9B is described.

The first and second photosensitive layers 112', 112" comprise different photosensitive materials, each having a different exposure intensity. For example, the first photosensitive layer 112' may comprise a first photosensitive material having a first exposure intensity X, whereas the second photosensitive layer 112" may comprise a second photosensitive material having a second exposure intensity Y different than the first exposure intensity X. The exposure intensities X, Y may, for example, each be integer values between 0 and 100. During edge exposure, the controller 122 may, for example, lookup the first and second exposure intensities X, Y in a lookup table 122lt by photosensitive material, and may set the LED driver 120 to drive the LED 114 so as to achieve the looked-up exposure intensity. In some embodiments, other parameters of the edge exposure may additionally and/or alternatively be varied by photoresist material. For example, where the ON/OFF state of the LED 114 is pulse width modulated, the duty cycle may be varied by photoresist material.

Figure 19:
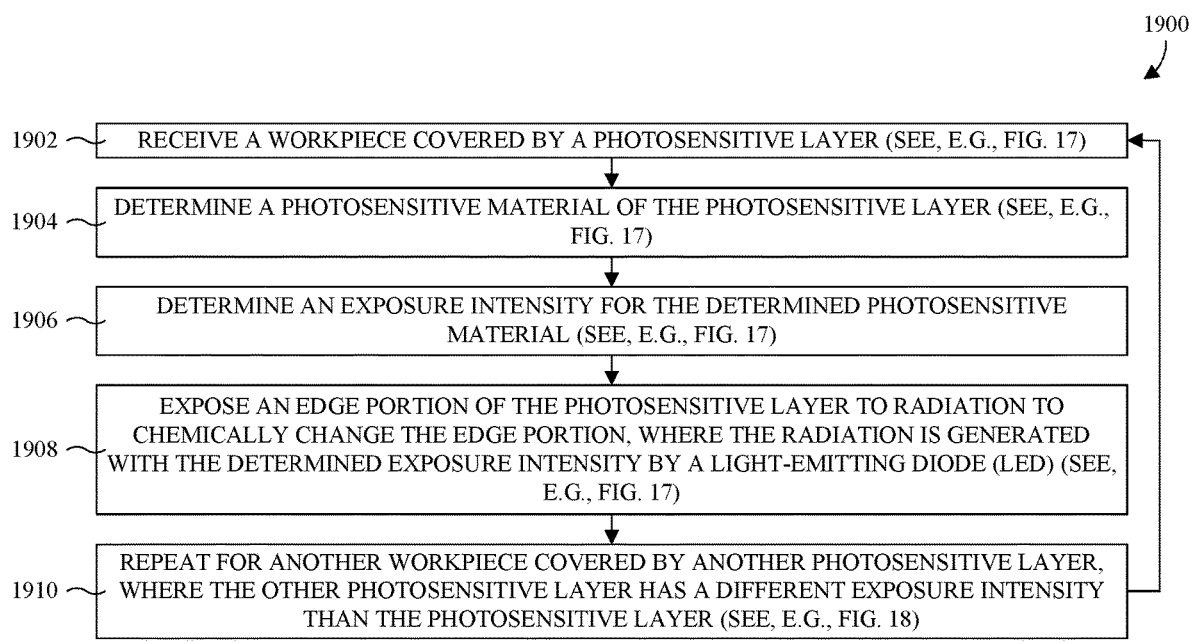
FIG. 19 illustrates a flowchart of some embodiments of a method for performing the LED-based edge exposure of FIGS. 17 and 18.

With reference to FIG. 19, a flowchart of some embodiments of a method for performing LED-based edge exposure at FIGS. 17 and 18 is provided. The method may, for example, be performed at 1604 of FIG. 16.

At 1902, a workpiece covered by a photosensitive layer is received. See, for example, FIG. 17.

At 1904, a photosensitive material of the photosensitive layer is determined. See, for example, FIG. 17. The photosensitive material may, for example, be automatically determined from a process control system using an identifier of the workpiece. The process control system may, for example, coordinate the manufacture of ICs in a semiconductor manufacturing facility.

At 1906, an exposure intensity for the determined photosensitive material is determined. See, for example, FIG. 17. In some embodiments, the exposure intensity is automatically determined by looking up the exposure intensity in a lookup table by the determined photosensitive material.

At 1908, an edge portion of the photosensitive layer is exposed to radiation to chemically change the edge portion, where the radiation is generated with the determined exposure intensity by a LED. See, for example, FIG. 17.

At 1910, the acts at 1902-1908 are repeated for another workpiece covered by another photosensitive layer, where the other photosensitive layer has a different exposure intensity than the photosensitive layer. See, for example, FIG. 18.

By varying the exposure intensity of the LED based on photosensitive material, a lifespan of the LED may be enhanced. Some photosensitive materials have high exposure intensities relative to other photosensitive materials. Operating the LED at a high exposure intensity causes the LED to operate at a high temperature, which reduces the lifespan of the LED faster than when the LED is operating at a low exposure intensity and hence a low temperature. Further, without varying the intensity of the LED based on photosensitive material, the LED operates at the highest exposure intensity for possible photosensitive materials to ensure each of the possible photosensitive materials is sufficiently irradiated. This is regardless of whether a photosensitive material being irradiated actually depends upon such a high exposure intensity. Therefore, for photosensitive materials with a low exposure intensity, the lifespan of the LED is needlessly reduced. Further, varying the intensity of the LED based on photosensitive material enhances the lifespan of the LED.

While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, a method for edge exposure includes: receiving a workpiece covered by a photosensitive layer; and exposing an edge portion of the photosensitive layer, but not a center portion of the photosensitive layer, to radiation generated by a LED, wherein the edge portion of the photosensitive layer extends along an edge of the workpiece in a closed path to enclose the center portion of the photosensitive layer. In some embodiments, the method further includes applying a chemical developer to the photosensitive layer to remove the edge portion of the photosensitive layer without removing the center portion of the photosensitive layer. In some embodiments, the method further includes rotating the workpiece during the exposing. In some embodiments, the radiation includes UV radiation. In some embodiments, the exposing includes alternatingly changing the LED between an ON state and an OFF state. In some embodiments, the exposing includes: determining a photosensitive material of the photosensitive layer; determining an exposure intensity for the determined photosensitive material; and setting an intensity of the LED to the determined exposure intensity. In some embodiments, the edge portion of the photosensitive layer has a ring-shaped top layout, and wherein the center portion of the photosensitive layer has a circle-shaped top layout. In some embodiments, the method further includes exposing a workpiece-id portion of the photosensitive layer to the radiation without moving the workpiece from its location during the exposing of the edge portion and without exposing the center portion of the photosensitive layer, wherein the workpiece-id portion of the photosensitive layer is surrounded by the center portion of the photosensitive layer. In some embodiments, the method further includes exposing an alignment-mark portion of the photosensitive layer to the radiation without moving the workpiece from its location during the exposing of the edge portion and without exposing the center portion of the photosensitive layer, wherein the alignment-mark portion of the photosensitive layer is surrounded by the center portion of the photosensitive layer.

In some embodiments, an edge-exposure tool includes: a process chamber; a workpiece table in the process chamber, wherein the process chamber is configured to support a workpiece covered by a photosensitive layer; a LED in the process chamber, wherein the LED is configured to emit radiation towards the workpiece; and a controller configured to control the LED to expose an edge portion of the photosensitive layer, but not a center portion of the photosensitive layer, to the radiation emitted by the LED, wherein the edge portion of the photosensitive layer extends along an edge of the workpiece in a closed path to enclose the center portion of the photosensitive layer. In some embodiments, the radiation includes UV radiation. In some embodiments, the edge-exposure tool further includes a mechanical arm supporting the LED over the workpiece table, wherein the mechanical arm is configured to move the LED over the workpiece. In some embodiments, the edge-exposure tool further includes an LED driver electrically coupled between the controller and the LED, wherein the LED driver is configured to apply a voltage across the LED and to regulate a flow of current through the LED in response to commands from the controller. In some embodiments, the edge-exposure tool further includes an image sensor underlying the LED, wherein the image sensor is configured to measure an intensity of the LED, and wherein the LED driver is configured to regulate the flow of current based on the measured intensity. In some embodiments, the edge-exposure tool further includes: an LED housing in the process chamber, wherein the LED is in the LED housing; and a temperature sensor in the LED housing, wherein the temperature sensor is configured to measure a temperature of the LED, and wherein the LED driver is configured to regulate the flow of current based on the measured temperature. In some embodiments, the controller includes an exposure controller and an LED controller, and wherein the LED controller is configured to simulate a lamp and to translate commands received from the exposure controller for the lamp to commands for the LED.

In some embodiments, a method for edge exposure includes: arranging a wafer within a process chamber, wherein the wafer is covered by a photosensitive layer; exposing an edge portion of the photosensitive layer, but not a center portion of the photosensitive layer, to UV radiation generated by a LED, wherein the UV radiation chemically changes the edge portion of the photosensitive layer, wherein the edge portion of the photosensitive layer extends along an edge of the wafer in a closed path to encircle the center portion of the photosensitive layer, and wherein the LED is in the process chamber; and rotating the wafer during the exposing. In some embodiments, the exposing includes: alternatingly changing the LED between an ON state and an OFF state; determining a photosensitive material of the photosensitive layer; determining an exposure intensity for the determined photosensitive material; and setting an intensity of the LED to the determined exposure intensity. In some embodiments, the determining of the exposure intensity includes lookup up the exposure intensity in a lookup table by the determined photosensitive material. In some embodiments, the method further includes applying a chemical developer to the photosensitive layer to remove the edge portion of the photosensitive layer without removing the center portion of the photosensitive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An edge-exposure tool comprising:
    a workpiece table configured to support a workpiece covered by a photosensitive layer, wherein the photosensitive layer has an interior portion, a center portion surrounding the interior portion, and a ring-shaped portion surrounding the center and interior portions and separated from the interior portion by the center portion;
    a light emitting diode (LED) configured to emit radiation towards the workpiece;
    a mechanical structure supporting the LED and configured to move the LED over the workpiece; and
    a controller configured to control the LED and the mechanical structure to expose the ring-shaped and interior portions, but not the center portion, to the radiation.

2. The edge-exposure tool according to claim 1, wherein the ring-shaped portion of the photosensitive layer is a portion of the photosensitive layer within a predetermined distance from an edge of the workpiece.

3. The edge-exposure tool according to claim 1, further comprising:
    a motor assembly configured to rotate the workpiece table, wherein the controller is configured to control the motor assembly to rotate the workpiece table while exposing the ring-shaped portion to the radiation and while exposing the interior portion to the radiation.

4. The edge-exposure tool according to claim 1, further comprising:
    a motor assembly configured to rotate the workpiece table, wherein the controller is configured to control the motor assembly to rotate the workpiece table while exposing the ring-shaped portion to the radiation, and wherein the controller is configured to control the motor assembly to stop rotation of the workpiece table while exposing the interior portion to the radiation.

5. The edge-exposure tool according to claim 1, further comprising a process chamber within which the workpiece table, the LED, and the mechanical structure are arranged, wherein the mechanical structure comprises an arm that is configured to suspend the LED over the workpiece table and that is configured to rotate about a pivot point along a sidewall of the process chamber to move the LED over the workpiece to the interior portion.

6. The edge-exposure tool according to claim 5, wherein the arm is configured to telescope to move the LED over the workpiece to the interior portion.

7. The edge-exposure tool according to claim 1, further comprising:
    an LED housing accommodating the LED; and
    a first lens on an underside of the LED housing and configured to transmit the radiation towards the workpiece.

8. The edge-exposure tool according to claim 7, wherein the mechanical structure comprises an arm, and wherein the edge-exposure tool further comprises:
    a mounting structure connecting the LED housing to the arm and defining a cavity within which the LED housing is arranged; and
    a second lens on an underside of the mounting structure and configured to transmit the radiation towards the workpiece, wherein the first lens is directly between the LED and the second lens.

9. The edge-exposure tool according to claim 8, wherein the first lens is configured to collimate the radiation, and wherein the second lens is configured to focus the radiation on the workpiece.

10. An edge-exposure tool comprising:
    a workpiece table configured to support a workpiece covered by a photosensitive layer;
    a light emitting diode (LED) configured to emit radiation towards the workpiece;
    an LED controller; and
    an LED driver electrically coupled between the LED controller and the LED;
    wherein the edge-exposure tool is configured to perform an exposure process to expose a ring-shaped edge portion, but not a center portion, of the photosensitive layer to the radiation, wherein the LED controller is configured to receive a first command specific to a light source different than the LED during the exposure process, wherein the LED controller, in response to the first command, is configured to translate the first command into a second command specific to the LED and to provide the second command to the LED driver, and wherein the LED driver is configured to regulate drive current to the LED in response to the second command.

11. The edge-exposure tool according to claim 10, wherein the edge-exposure tool is further configured to perform another exposure process to expose an interior portion, but not the center portion, of the photosensitive layer to the radiation using the LED, and wherein the interior portion is separated from the ring-shaped edge portion by the center portion.

12. The edge-exposure tool according to claim 10, further comprising:
    an exposure controller configured to provide the LED controller with the first command, wherein the exposure controller is independent of the LED controller.

13. The edge-exposure tool according to claim 10, wherein the LED controller and the LED driver are independent of each other.

14. The edge-exposure tool according to claim 10, further comprising:
   a first lens having a light-receiving surface and a light-emitting surface on opposite sides of the first lens and respectively facing the LED and the workpiece table, wherein the first lens is configured to receive the radiation at the light-receiving surface;
   a mounting structure suspended over the workpiece table, wherein the first lens is mounted to a bottom of the mounting structure;
   an LED housing overlying and spaced from the first lens, wherein the LED housing is mounted to the mounting structure and accommodates the LED; and
   a second lens mounted to a bottom of the LED housing, wherein the second lens is between the first lens and the LED housing and is spaced from the first lens.

15. The edge-exposure tool according to claim 10, further comprising:
   a temperature sensor in the LED housing, wherein the LED driver is configured to vary the drive current to the LED based on feedback from the temperature sensor.

16. An exposure tool comprising:
   a workpiece table configured to support a workpiece covered by a photosensitive layer;
   a light emitting diode (LED) configured to emit radiation towards the workpiece;
   an LED controller;
   an LED driver electrically coupled between the LED controller and the LED, wherein the LED driver is configured to regulate drive current to the LED in response to commands from the LED controller; and
   an exposure controller configured to provide the LED controller with a first command specific to a light source different than the LED, wherein the LED controller is configured to translate the first command into a second command specific to the LED, and to provide the second command to the LED driver, in response to receiving the first command;
   wherein the exposure tool is configured to perform an exposure process to expose a first portion of the photosensitive layer to the radiation, and wherein the exposure controller is configured to provide the first command to the LED controller during the exposure process.

17. The exposure tool according to claim 16, wherein the workpiece has a sidewall extending laterally in a closed path around the workpiece, and wherein the first portion of the photosensitive layer is a portion of the photosensitive layer within a predetermined distance of the sidewall.

18. The exposure tool according to claim 16, wherein the exposure tool is configured to perform the exposure process to expose the first portion of the photosensitive layer and a second portion of the photosensitive layer, but not a third portion of the photosensitive layer, to the radiation, and wherein the first portion is at an edge of the workpiece, and wherein the second portion is spaced from the edge and the first portion by the second portion.

19. The exposure tool according to claim 18, wherein the exposure tool is configured so relative positioning between the workpiece and the workpiece table does not change from a beginning of the exposure process to an end of the exposure process.

20. The exposure tool according to claim 16, wherein the LED driver and the exposure controller are independent of each other.

* * * * *